(12) United States Patent
Audet et al.

(10) Patent No.: US 11,437,779 B2
(45) Date of Patent: Sep. 6, 2022

(54) VERNIER EFFECT DBR LASERS INCORPORATING INTEGRATED TUNING ELEMENTS

(71) Applicant: Apple Inc., Cupertino, CA (US)

(72) Inventors: Ross M. Audet, Menlo Park, CA (US); Mark Alan Arbore, Los Altos, CA (US); Alfredo Bismuto, San Jose, CA (US); Yves Bidaux, Neuchâtel (CH); Camille Tardy, Yverdon-les-Bains (CH); Tobias Gresch, Yverdon-les-Bains (CH); Antoine Jean André Müller, Neuchâtel (CH)

( * ) Notice: Subject to any disclaimer, the term of this patent is extended or adjusted under 35 U.S.C. 154(b) by 0 days.

(21) Appl. No.: 15/570,683

(22) PCT Filed: Apr. 27, 2016

(86) PCT No.: PCT/US2016/029619
§ 371 (c)(1),
(2) Date: Oct. 30, 2017

(87) PCT Pub. No.: WO2016/176364
PCT Pub. Date: Nov. 3, 2016

(65) Prior Publication Data
US 2018/0183207 A1   Jun. 28, 2018

Related U.S. Application Data

(60) Provisional application No. 62/155,385, filed on Apr. 30, 2015.

(51) Int. Cl.
*H01S 5/0625* (2006.01)
*H01S 5/125* (2006.01)
(Continued)

(52) U.S. Cl.
CPC ........ *H01S 5/06256* (2013.01); *H01S 5/0612* (2013.01); *H01S 5/06258* (2013.01);
(Continued)

(58) Field of Classification Search
CPC ... H01S 5/0612; H01S 5/06255–06256; H01S 5/125; H01S 5/06256; H01S 5/1206–1218; H01S 5/1215–1218
See application file for complete search history.

(56) References Cited

U.S. PATENT DOCUMENTS 4,896,325 A * 1/1990 Coldren .............. H01S 5/06256
                                                          372/102
5,325,392 A * 6/1994 Tohmori ................ G02B 6/124
                                                          372/96
(Continued)

FOREIGN PATENT DOCUMENTS

EP   1 753 104 A2   2/2007
EP   2 091 118 A1   8/2009
(Continued)

OTHER PUBLICATIONS

Tohmori et al., "Broad-Range Wavelength-Tunable Superstructure Grating (SSG) DBR Lasers", IEEE Journal of Quantum Electronics, vol. 29, No. 6, Jun. 1993 (Year: 1993).*
(Continued)

*Primary Examiner* — Sean P Hagan
(74) *Attorney, Agent, or Firm* — Brownstein Hyatt Farber Schreck, LLP

(57) ABSTRACT

Disclosed is a Vernier effect DBR laser that has uniform laser injection current pumping along the length of the laser. The laser can include one or more tuning elements, separate from the laser injection element, and these tuning elements can be used to control the temperature or modal refractive index of one or more sections of the laser. The refractive
(Continued)

indices of each diffraction grating can be directly controlled by temperature changes, electro optic effects, or other means through the one or more tuning elements. With direct control of the temperature and/or refractive indices of the diffraction gratings, the uniformly pumped Vernier effect DBR laser can be capable of a wider tuning range. Additionally, uniform pumping of the laser through a single electrode can reduce or eliminate interfacial reflections caused by, for example, gaps between metal contacts atop the laser ridge, which can minimize multi-mode operation and mode hopping.

21 Claims, 20 Drawing Sheets

(51) Int. Cl.
　　*H01S 5/12*　　　　(2021.01)
　　*H01S 5/06*　　　　(2006.01)
　　*H01S 5/0683*　　　(2006.01)
　　*H01S 5/34*　　　　(2006.01)

(52) U.S. Cl.
　　CPC .......... *H01S 5/06837* (2013.01); *H01S 5/125* (2013.01); *H01S 5/1206* (2013.01); *H01S 5/1209* (2013.01); *H01S 5/1218* (2013.01); *H01S 5/3401* (2013.01)

(56) References Cited

U.S. PATENT DOCUMENTS

| | | | |
|---|---|---|---|
| 5,341,391 A * | 8/1994 | Ishimura | H01S 5/0612 372/34 |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,345,135 B1 * | 2/2002 | Reid | G02B 6/122 372/102 |
| 6,647,032 B1 | 11/2003 | Lee et al. | |
| 6,690,387 B2 | 2/2004 | Zimmerman et al. | |
| 6,690,693 B1 | 2/2004 | Crowder | |
| 6,990,129 B2 | 1/2006 | Buimovich et al. | |
| 7,015,894 B2 | 3/2006 | Morohoshi | |
| 7,184,064 B2 | 2/2007 | Zimmerman et al. | |
| 7,620,078 B2 * | 11/2009 | Mori | G01J 3/10 372/20 |
| 7,663,607 B2 | 2/2010 | Hotelling et al. | |
| 8,457,172 B2 * | 6/2013 | Reid | H01S 5/125 372/20 |
| 8,479,122 B2 | 7/2013 | Hotelling et al. | |
| 2002/0075918 A1* | 6/2002 | Crowder | H01S 5/125 372/38.02 |
| 2002/0181521 A1 | 12/2002 | Crowder et al. | |
| 2004/0151215 A1* | 8/2004 | Reid | H01S 5/06256 372/20 |
| 2004/0174915 A1* | 9/2004 | Sarlet | H01S 5/06256 372/20 |
| 2004/0218639 A1* | 11/2004 | Oh | H01S 5/227 372/20 |
| 2006/0088068 A1 | 4/2006 | Farrel et al. | |
| 2006/0153253 A1* | 7/2006 | Diffily | H01S 5/06256 372/29.02 |
| 2006/0197753 A1 | 9/2006 | Hotelling | |
| 2007/0036188 A1* | 2/2007 | Fujii | H01S 5/06256 372/50.11 |
| 2007/0116076 A1 | 5/2007 | Wang et al. | |
| 2008/0063016 A1 | 3/2008 | Bhatia et al. | |
| 2008/0159341 A1 | 7/2008 | Patel et al. | |
| 2012/0051386 A1 | 3/2012 | Kim et al. | |
| 2013/0156052 A1 | 6/2013 | Diehl et al. | |
| 2013/0223461 A1 | 8/2013 | Ensher et al. | |
| 2014/0307753 A1* | 10/2014 | Minneman | H01S 3/10 372/20 |
| 2018/0083421 A1 | 3/2018 | Audet | |
| 2019/0190233 A1 | 6/2019 | Audet | |
| 2020/0153202 A1 | 5/2020 | Audet et al. | |

FOREIGN PATENT DOCUMENTS

| | | | | |
|---|---|---|---|---|
| EP | 2 120 301 A1 | 11/2009 | | |
| EP | 2 849 294 A1 | 3/2015 | | |
| GB | 2380058 A * | 3/2003 | ......... H01S 5/06255 |
| JP | 04-116878 A | 4/1992 | | |
| JP | 2000-163031 A | 6/2000 | | |
| JP | 2002-342033 A | 11/2002 | | |
| JP | 2005-175021 A | 6/2005 | | |
| JP | 2010-503987 A | 2/2010 | | |
| JP | 2015-115411 A | 6/2015 | | |
| WO | WO-9611416 A1 * | 4/1996 | ............ G02B 6/124 |
| WO | WO-2008/033251 A1 | 3/2008 | | |
| WO | WO-2016/144831 A1 | 9/2016 | | |
| WO | WO 16/176364 | 11/2016 | | |

OTHER PUBLICATIONS

International Search Report dated May 20, 2016, for PCT Application No. PCT/US2016/021075, filed Mar. 4, 2016, six pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Non-Final Office Action dated Jun. 29, 2018, for U.S. Appl. No. 15/555,049, filed Aug. 31, 2017, eleven pages.

Notice of Allowance dated Nov. 21, 2018, for U.S. Appl. No. 15/555,049, filed Aug. 31, 2017, nine pages.

* cited by examiner

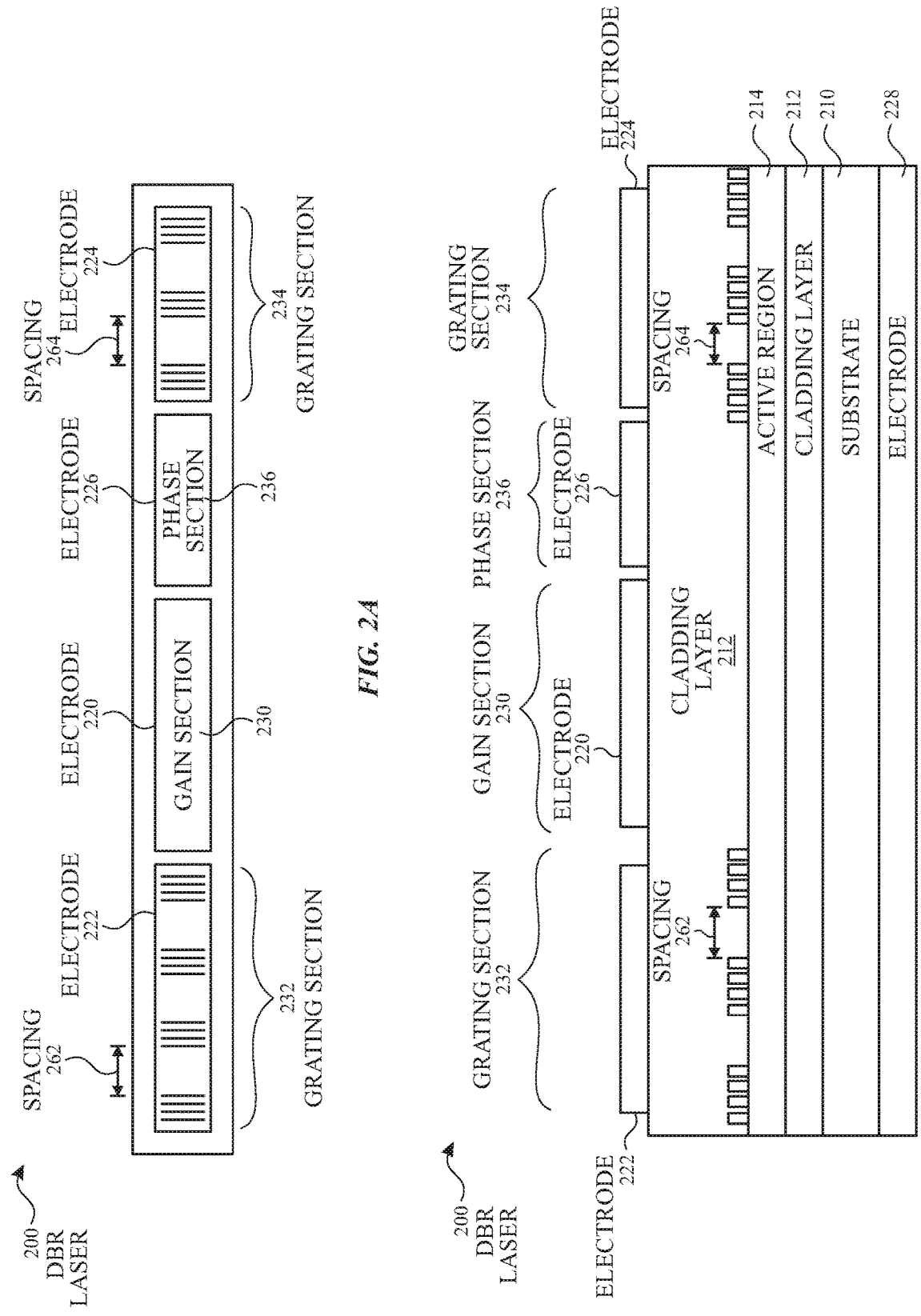

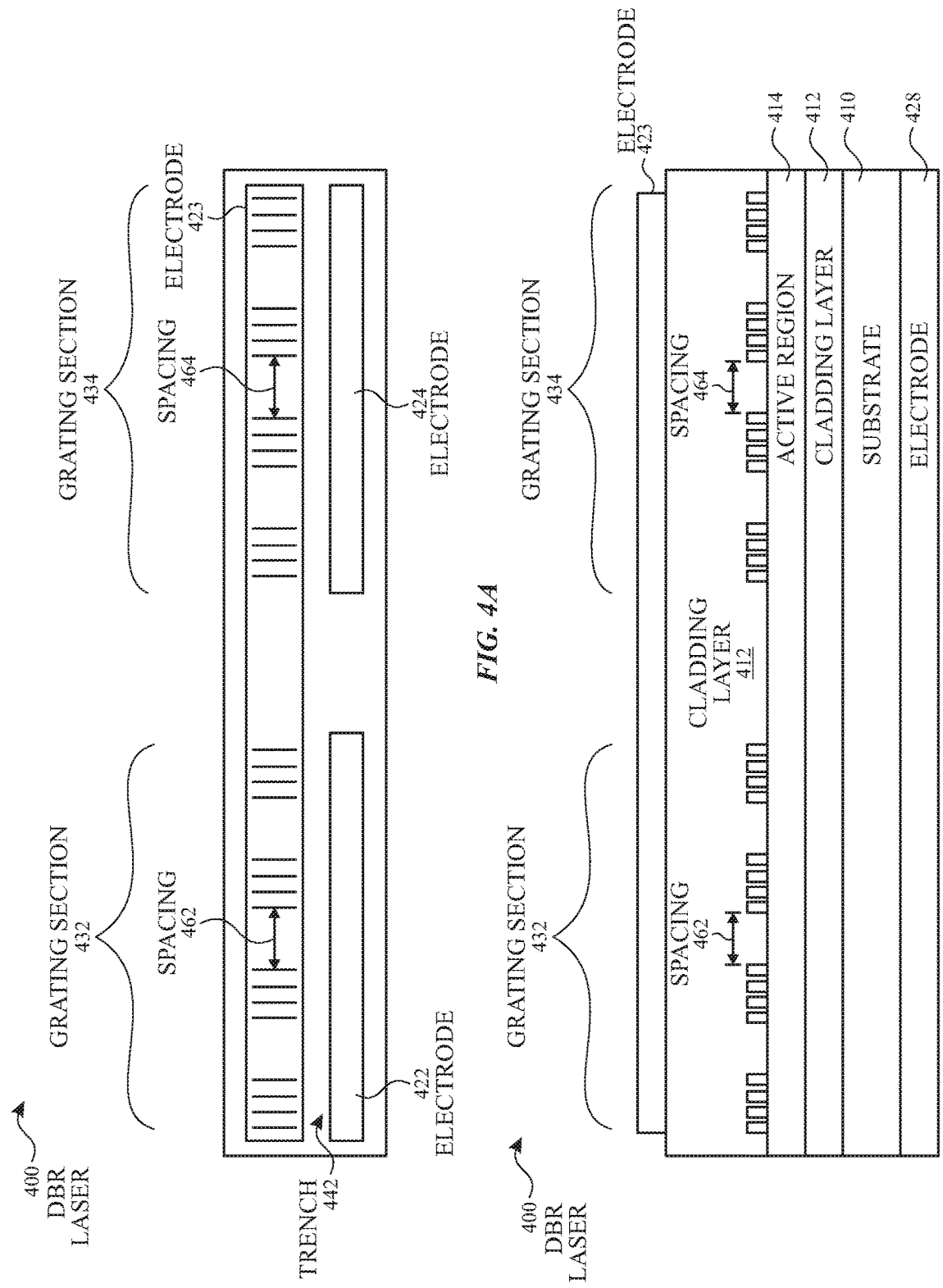

VERNIER EFFECT DBR LASERS INCORPORATING INTEGRATED TUNING ELEMENTS

CROSS-REFERENCE TO RELATED APPLICATIONS

This application is a National Phase Patent Application under 35 U.S.C. § 371 of International Application No. PCT/US2016/029619, filed Apr. 27, 2016, which claims the benefit of U.S. Provisional Patent Application 62/155,385, filed Apr. 30, 2015, which are incorporated herein by reference in their entirety.

FIELD

This relates generally to a distributed Bragg reflector (DBR) semiconductor laser incorporating integrated tuning elements, and more particularly to a Vernier effect DBR laser that has uniform laser injection current pumping along the length of the laser.

BACKGROUND

Semiconductor lasers are necessary for many applications, such as trace gas detection, environmental monitoring, biomedical diagnostics, telecommunications, and industrial process controls. These applications can benefit from tunable lasers with extremely narrow linewidths and single frequency emission.

A conventional DBR laser can be tuned through heating of the submount or modulation of the injection current into one or more electrodes positioned above the grating or gain section of the device. However, the tuning performance of these conventional DBR lasers can be limited with slow modulation times, and narrow tuning ranges. The tuning range of these conventional DBR lasers can be substantially expanded by exploiting the "Vernier effect." Vernier effect DBR lasers (including Vernier effect sampled grating (SG) DBR lasers, Vernier effect phase-reversal grating DBR lasers, Vernier effect superstructure grating (SSG) DBR lasers, and Vernier effect binary superimposed grating (BSG) DBR lasers) can have expanded tuning range, but often have extremely unpredictable wavelength tuning behavior, and thus can require extensive post-fabrication characterization and precise temperature and current control to achieve predictable wavelength output.

SUMMARY

This relates to a Vernier effect DBR laser that has uniform laser injection current pumping along the length of the laser. The laser can include one or more tuning elements, separate from the laser injection element, and these tuning elements can be used to control the temperature or modal refractive index of different sections of the laser. The laser can have improved tuning characteristics and stability relative to a standard Vernier effect DBR laser.

BRIEF DESCRIPTION OF THE DRAWINGS

FIG. 2A illustrates a top view of an exemplary Vernier effect DBR laser according to examples of the disclosure.

FIG. 2B illustrates a longitudinal view of an exemplary Vernier effect DBR laser according to examples of the disclosure.

FIGS. 4A-4B illustrate top and longitudinal views of an exemplary uniformly pumped Vernier effect SG-DBR laser including integrated tuning elements according to examples of the disclosure.

DETAILED DESCRIPTION

Figure 1:
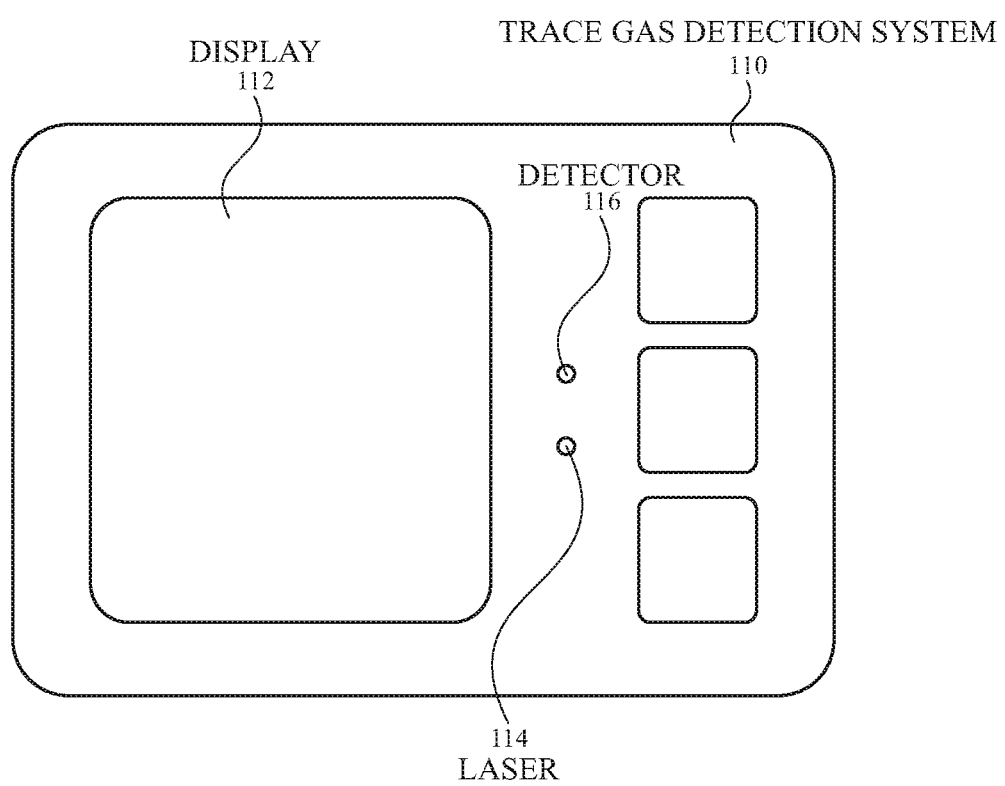
FIG. 1 illustrates an exemplary system in which examples of the disclosure can be implemented.

In the following description of examples, reference is made to the accompanying drawings in which it is shown by way of illustration specific examples that can be practiced. It is to be understood that other examples can be used and structural changes can be made without departing from the scope of the various examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one step is described after the other step). Moreover, the illustration of a process by its description in a drawing does not imply that the illustrated process is exclusive of other variations and modification thereto, does not imply that the illustrated process or any of its steps are necessary to one or more of the examples, and does not imply that the illustrated process is preferred.

This disclosure relates to a Vernier effect DBR laser that has uniform laser injection current pumping along the length of the laser. The laser can include one or more tuning elements, separated from the laser injection element, and these tuning elements can be used to control the temperature or modal refractive index of one or more sections of the laser. The one or more tuning elements can be located near the active region of the laser, and can include one or more trenches to constrict current to generate heat in a nearby active region. By using one or more tuning elements, refractive indices of each diffraction grating can be directly controlled by temperature changes, electro optic effects, or other means. With direct control of the temperature and/or refractive indices of the diffraction gratings, the uniformly pumped Vernier effect DBR laser can be capable of a wider tuning range. Additionally, uniform pumping of the laser through a single electrode can reduce or eliminate interfacial reflections caused by, for example, gaps between metal contacts atop the laser ridge, which can minimize multimode operation and mode hopping. As result, the uniformly pumped Vernier effect DBR laser according to examples of the disclosure can be capable of continuous or discontinuous tuning with improved performance in tuning range, reproducibility, and predictability. Integrating these uniformly pumped Vernier effect DBR lasers into a system can then lead to lower manufacturing costs, improved wavelength stability, and increased laser operating conditions compared to other Vernier effect DBR lasers, and can be more compact, have faster tuning speed, and improved stability compared to other widely tunable lasers, such as external cavity lasers.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

FIG. 1 illustrates an exemplary system in which examples of the disclosure can be implemented. Trace gas detection system 110 can include a display 112, laser 114, and detector 116. Laser 114 can be any of the exemplary uniformly pumped Vernier effect DBR lasers and can be configurably operable using any of the methods and waveforms as will be disclosed.

Tunable semiconductor lasers are needed for many applications, such as trace gas detection, environmental monitoring, biomedical diagnostics, telecommunications, and industrial process controls. These applications, in particular, can benefit from tunable lasers with narrow linewidths and single frequency emission. The tuning capability can be crucial in order to allow light emission to be scanned across a wavelength region of interest. Additionally, many applications can benefit from being able to accurately predict the tuning behavior of the laser and can also benefit from the capability of modulation at high frequencies (e.g., frequencies greater than 1 kHz). Some applications can further benefit from continuous tuning, which is incrementally changing the laser emission wavelength in the absence of mode hops, over certain subsets of the entire range of wavelengths the device is capable of emitting at.

Although sometimes used in large, bulky systems, tunable semiconductor lasers can have many uses in portable or compact-sized electronic devices. For example, wall-mountable trace gas detection system 110 can be located in a user's garage and can be used to detect whether the exhaust from an automobile parked in the garage exceeds a safe level. The wall-mountable trace gas detection system 110 can provide a warning on display 112 and additionally, can transmit the information to a mobile telephone. In response, the mobile telephone can warn the user of the hazard and can prevent the user from entering the garage.

Figure 2C:
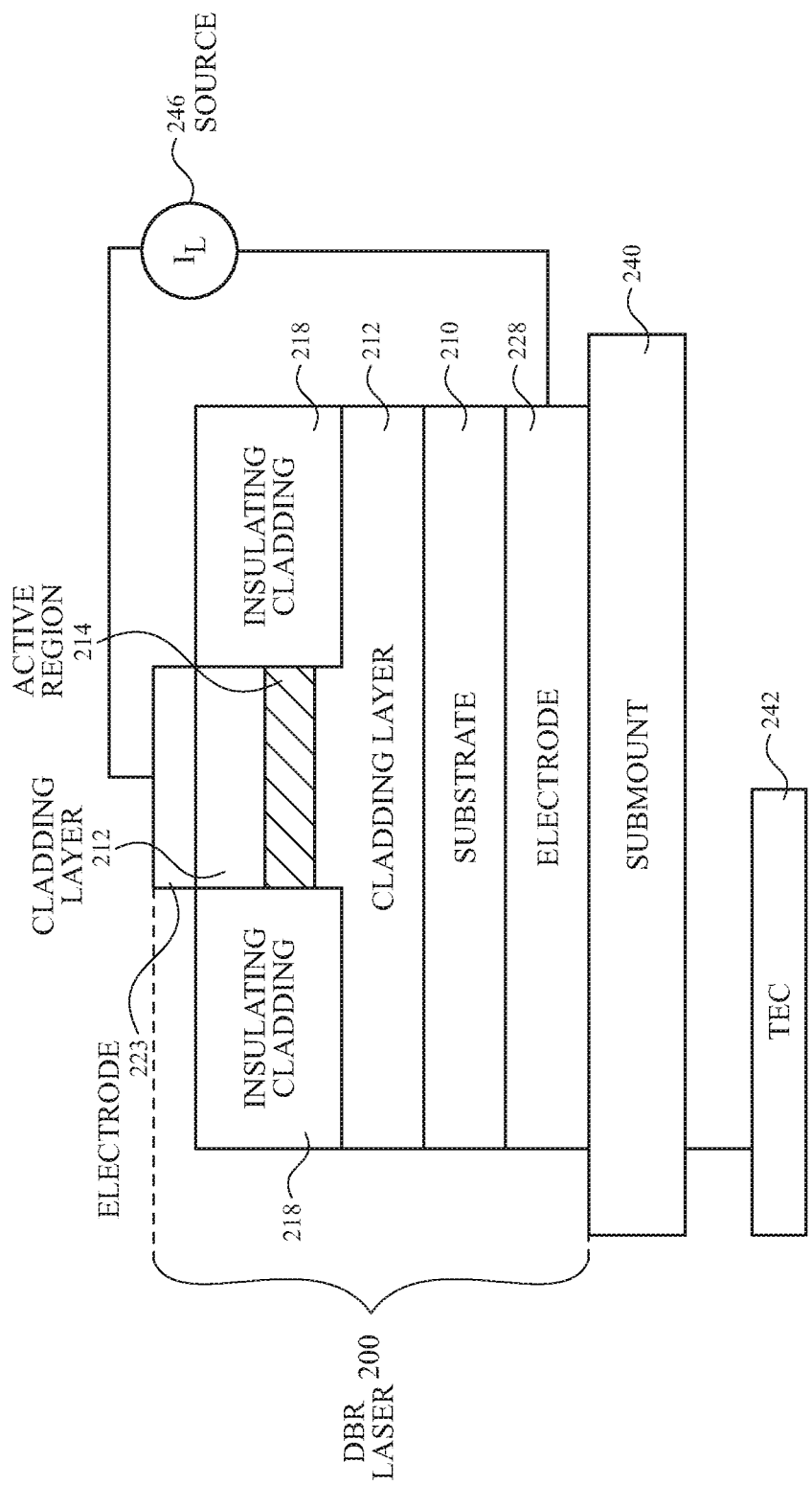
FIG. 2C illustrates a cross-sectional view of an exemplary Vernier effect DBR laser according to examples of the disclosure.

One way to select the emission wavelength of a laser can be to incorporate a periodic structure into the semiconductor laser. FIGS. 2A-2C illustrate a top, a longitudinal, and a cross-sectional view of an exemplary Vernier effect DBR laser according to examples of the disclosure. Vernier effect DBR laser 200 can comprise an electrode 228, substrate 210, cladding layers 212, insulating cladding 218, active region 214, and electrodes 220, 222, 224, and 226. Electrode 223 referred to in FIG. 2C can be representative of either electrode 220, 222, 224, or 226, where each electrode 220, 222, 224, and 226 can be coupled to a source 246. Source 246 referred to in FIG. 2C can be representative of any source coupled to one or more of the electrodes 220, 222, 224, and 226.

To configure the laser with the capability of tuning, the optical cavity of Vernier effect DBR laser 200 can be separated into multiple sections, where each section can be coupled to an electrode, and current can be injected into each electrode. These multiple sections can include grating sections 232 and 234, gain section 230, and phase section 236, where each section can be electrically separated from one another. Grating sections 232 and 234 can be located on or above the active region 214 and can serve as mirrors to partially reflect light back into the cavity of the laser to form a resonator.

Vernier effect DBR laser 200 can be mounted to or touching submount 240. The gain section 230 can be driven or pumped through electrode 220 by a source that supplies a pump current $I_L$. The pump current can be such that the gain becomes sufficient in the laser cavity to overcome cavity losses, resulting in lasing and an emitted beam of laser light. Phase section 236 can have a tunable refractive index, for example, caused by heating through current injected through electrode 226, which can be used to change or control the overall optical path length of the laser cavity. Grating sections 232 and 234 can include a constant pitch diffraction grating, where a spacing can be created between subsections of the diffraction gratings. For example, grating section 232 can include spacing 262, and grating section 234 can include spacing 264, where spacing 262 can be different from spacing 264. Each grating section can be coupled to a source through the electrodes. Each source can inject a tuning current to cause a change in temperature of the diffraction gratings, which can then cause a change in the grating pitch and its reflectance spectrum.

Figure 2D:
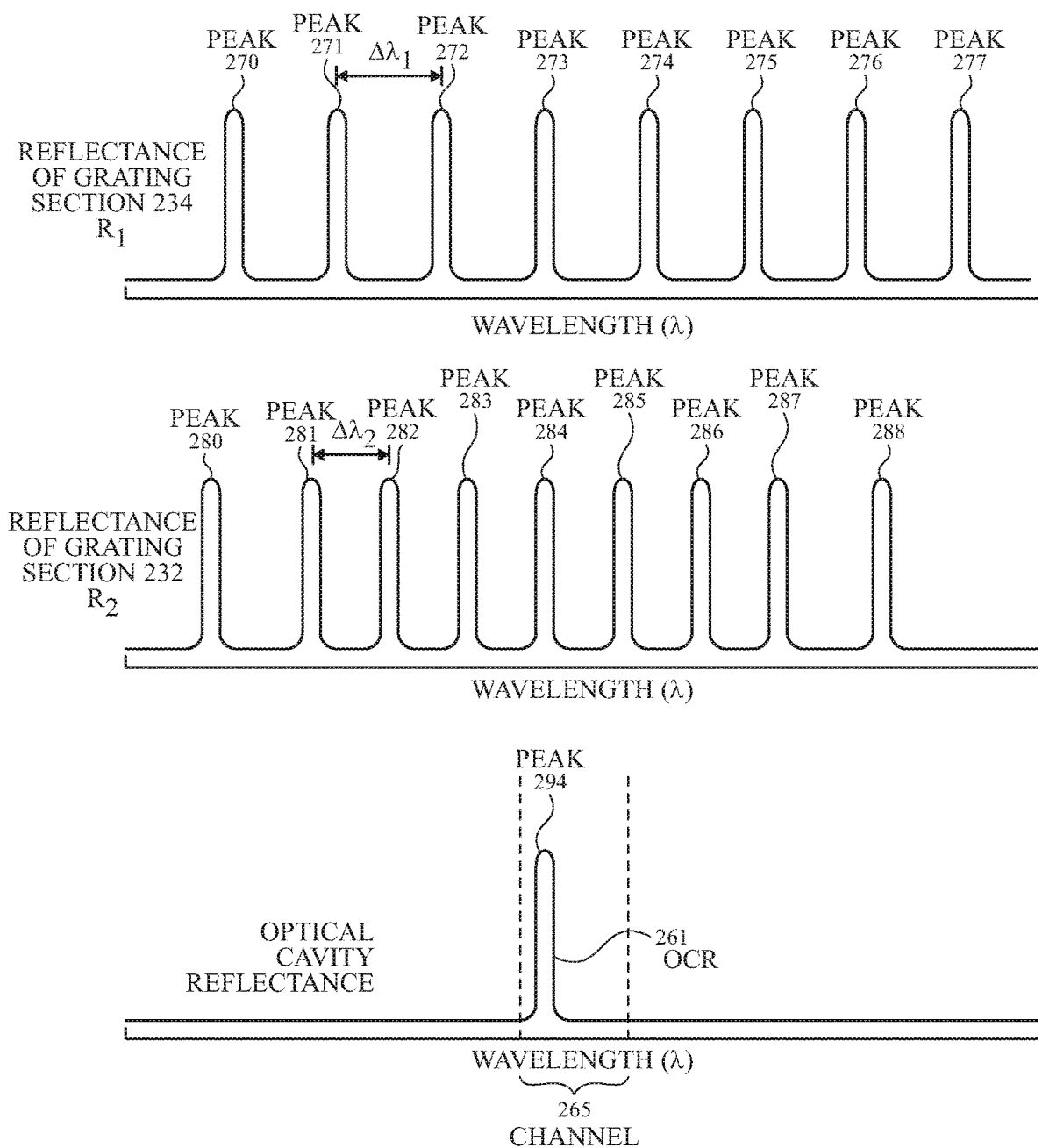
FIG. 2D illustrates exemplary reflectance spectra of the grating sections and total optical cavity of a Vernier effect DBR laser according to examples of the disclosure.

FIG. 2D illustrates exemplary reflectance spectra of the grating sections (or mirrors) and total optical cavity of a Vernier effect DBR laser according to examples of the disclosure. Each grating section can be configured to partially reflect light back into the gain section 230. That is, the grating sections 232 and 234 can act as mirrors, whose reflectivity can vary with wavelength. Grating section 234 can have a reflectance spectrum $R_1$ that comprises evenly spaced peaks 270-277 at every $\Delta\lambda_1$ wavelengths, due to spacing 264 exhibiting a comb-like reflectivity. Grating section 232 can have a reflectance spectrum $R_2$ that also comprises evenly spaced peaks 280-288 and exhibits a comb-like reflectivity, with peaks 280-288 occurring at every $\Delta\lambda_2$ wavelengths due to spacing 262. In some examples, $\Delta\lambda_2$ can be different from $\Delta\lambda_1$.

Tuning of the Vernier effect DBR laser can be achieved by taking advantage of the Vernier effect. With the Vernier effect, a small relative change in the refractive indices of the gratings can be used to achieve large relative emission wavelength change. The reflection peaks from the reflectance spectra $R_1$ and $R_2$ can overlap at a wavelength to produce an optical cavity reflectance spectrum OCR 261 comprising peak 294. Peak 294 can be due to peak 273 of $R_1$ overlapping with peak 284 of $R_2$. This overlap of reflection peaks in $R_1$ and $R_2$ can cause sufficient cavity gain and can lead to lasing and light emission at the overlapping wavelength. That is, lasing action can occur at a wavelength for which both the mirror reflectivities present a maximum (e.g., a peak reflectance with a slope equal to zero). Therefore, the wavelength spacings (e.g., $\Delta\lambda_1$ and $\Delta\lambda_2$) can be one factor that affects the emission wavelength of the laser. Generally, a larger difference between wavelengths spacings $\Delta\lambda_1$ and $\Delta\lambda_2$ can lead to a larger tuning range. Channel 265 can include peak 294, where a channels can correspond to a range around a single peak (e.g., peak 294) where tuning can be achieved by simultaneously adjusting both gratings. In some examples, the width of channel 265 can be less than $\Delta\lambda_1$ and $\Delta\lambda_2$.

A way to tune the emission wavelength of Vernier effect DBR laser 200 can be to adjust the temperature of the active region 214. To adjust the temperature of the active region 214, a thermo-electric cooler (TEC) 242 can apply or remove heat to or from submount 240. The heat can pass through the electrode 228, substrate 210, and cladding layer 212 to active region 214, which can cause a change in the refractive index of the grating (located on or above active region 214). The change in refractive index can lead to a change in the emission wavelength. Therefore, the emission wavelength of Vernier effect DBR laser 200 can be tuned by changing the heat applied through TEC 242. However, there can be a few problems with tuning by applying heat or removing heat from the submount. Heating or cooling the temperature of the laser can require a lot of power from TEC 242. Requiring a lot of power may not be practical for certain devices, such as portable or compact-sized electronic devices, which can have stringent power constraints due to portability and size requirements. Additionally, heating the Vernier effect DBR laser 200 using TEC 242 can lead to a slow response resulting in slow tuning speeds, as TEC 242 may need to cool and heat the Vernier effect DBR laser 200, submount 240, and heat sink (not shown). Accordingly, the time delay between applying the heat and achieving the targeted emission wavelength can be on the order of seconds, and many applications may need quicker adjustment of the laser emission wavelength.

The emission wavelength can also be tuned through each source (not shown) coupled to each grating section 232 and 234 through electrodes 222 and 224. Each source can cause a change in the temperature of each corresponding grating section. A change in the temperature of the diffraction gratings can lead to a refractive index change, which can shift the reflectance spectrum $R_1$ or $R_2$. By shifting the reflectance spectrum $R_1$ or $R_2$, the Vernier effect can be exploited.

However, tuning the Vernier effect DBR laser by adjusting the sources coupled to the grating sections 232 and 234 can lead to a limited tuning range. For Vernier effect DBR laser 200, the gain of the laser can be affected by not only the pump current (from source 246) injected into gain section 230, but also the gain can be affected by the currents injected into the grating sections 232 and 234. When the current injected into a grating section is increased (to increase the temperature of the corresponding diffraction gratings) beyond a threshold value, the gain can become sufficiently high such that lasing occurs within the corresponding grating section. When the current injected into a grating section is decreased (to decrease the temperature of the corresponding diffraction gratings) below another threshold value, the loss can dominate such that lasing does not occur in the gain section 230. As a result, the grating sections 232 and 234 can have a limited temperature operation range, which can limit the amount to which $R_1$ and $R_2$ can be shifted, and therefore, can lead to a limited tuning range.

Figure 3A:
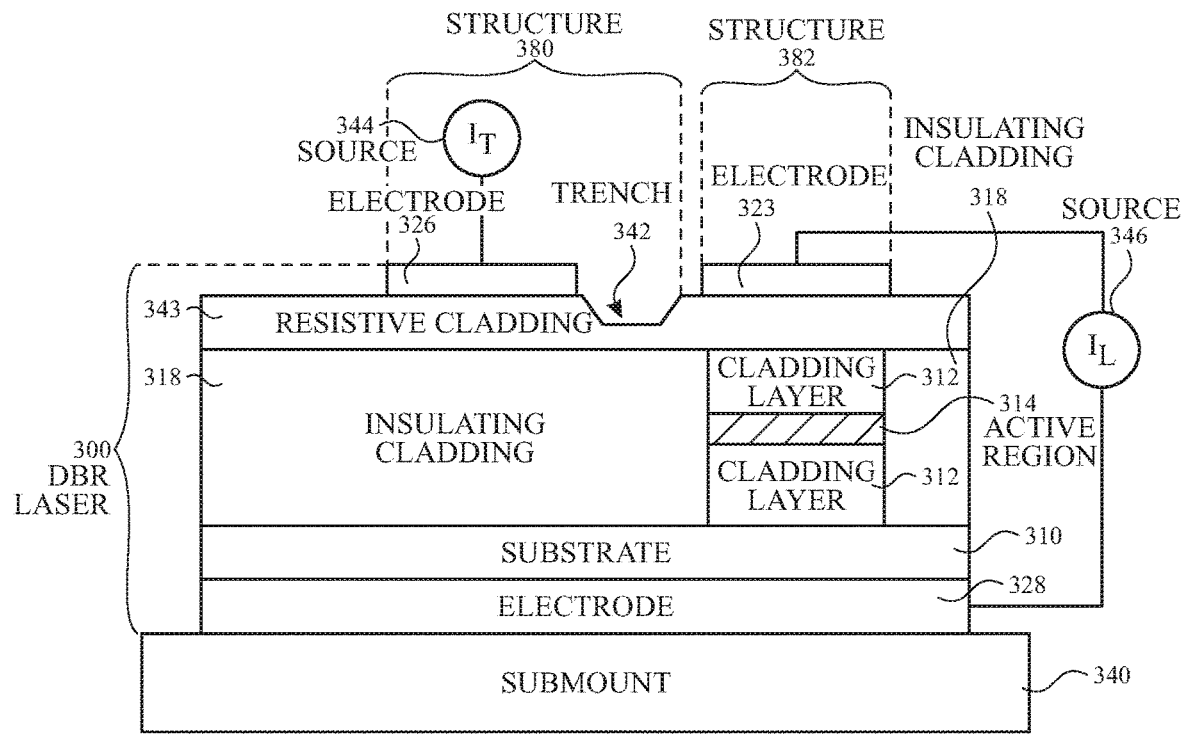
FIG. 3A illustrates a cross-sectional view of an exemplary Vernier effect DBR laser including integrated tuning elements according to examples of the disclosure.

One way to overcome the problems encountered when tuning through a TEC or through the pump current can be to use integrated tuning elements. FIG. 3A illustrates a cross-sectional view of an exemplary Vernier effect DBR laser with integrated tuning elements according to examples of the disclosure. Vernier effect DBR laser 300 can comprise a substrate 310, cladding layers 312, insulating cladding 318, active region 314, electrodes 323, 326, and 328, and resistive cladding 343. Vernier effect DBR laser 300 can comprise a plurality of structures, such as structures 380 and 382. Structure 380 can be a tuning element, and structure 382 can be a laser structure, for example. A source 346 can be coupled to the electrodes 323 and 328 of the structure 382 to inject a pump current $I_L$ to drive or pump the Vernier effect DBR laser 300. Tuning element or structure 380 can be an electrically contacted structure that is located within close proximity to structure 382. Source 344 can be coupled to the electrode 326 to provide a tuning current $I_T$ to drive the tuning element or structure 380. In some examples, Vernier effect DBR laser 300 can include a trench 342 that can act as an electrical resistor by constricting the current flow generated by source 344 to build up heat in the nearby active region 314. While FIG. 3A shows sources 344 and 346 as current sources, one skilled in the art would understand that any type of source can be used.

Figure 3B:
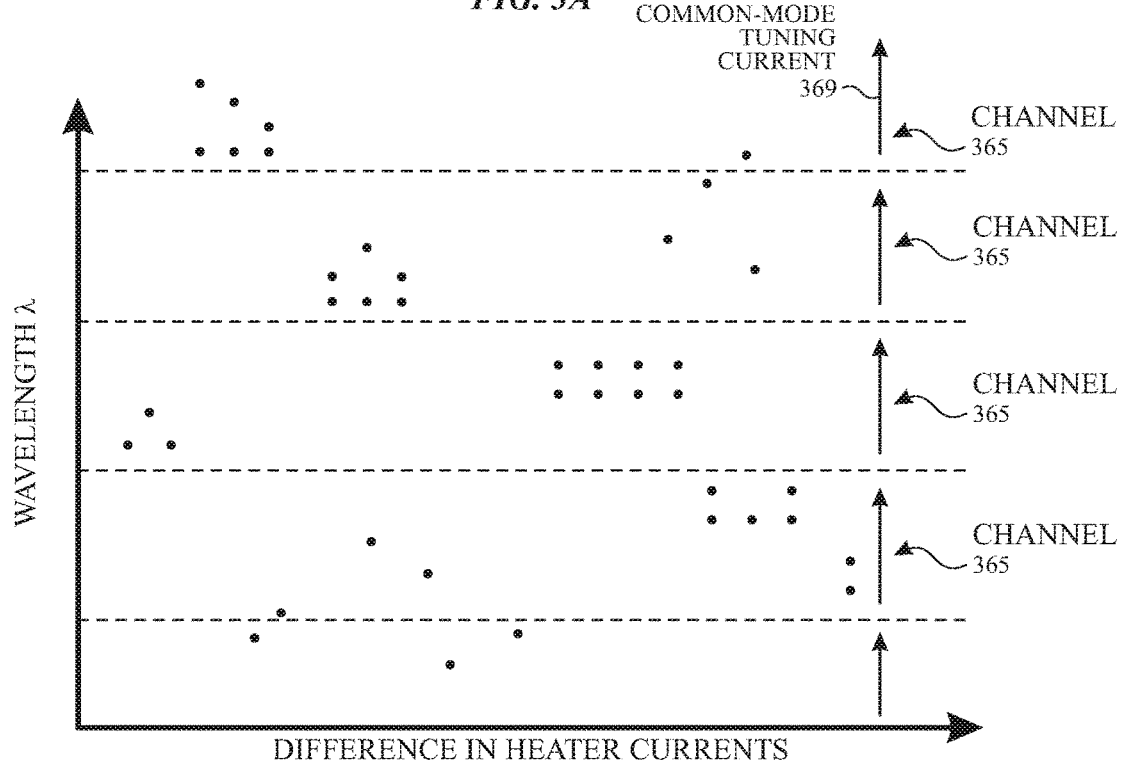
FIG. 3B illustrates an exemplary plot of the emission wavelength with varying differences in tuning currents of the grating sections of a Vernier effect DBR laser including integrated tuning elements according to examples of the disclosure.

Although wavelength tuning can be achieved in the Vernier effect laser by integrating tuning elements, as illustrated in FIG. 3A, and adjusting the one or more tuning currents, the optical tuning can be limited to being non-monotonic and can also lead to the need for complicated and customized pumping schemes. These complicated and customized pumping schemes can limit the optical tuning speed and capabilities of the laser. FIG. 3B illustrates an exemplary plot of emission wavelength with varying differences in tuning current of the grating sections of a Vernier effect DBR laser including integrated tuning elements according to examples of the disclosure. The figure illustrates the problem of "mode hopping" or multi-mode operation that can exist in a Vernier effect DBR laser, regardless of whether the integrated tuning elements are integrated into the laser (such as Vernier effect DBR laser 200 illustrated in FIG. 2A and Vernier effect DBR laser 300 illustrated in FIG. 3A). Mode hopping can occur when the laser suddenly transitions from operating on a single resonator mode to operating on a different mode, causing the different mode to take over substantially all of the optical power. Multi-mode operation can occur when there are transitions between different sets of modes. External influences, such as temperature fluctuations, interfacial reflections, or optical phase mismatch within the laser cavity, can cause the laser to compete between or randomly switch from one mode to another, leading to emission at unwanted, unpredictable wavelengths, as illustrated in the figure. Additionally, mode hopping and multi-mode operation can make it difficult to obtain predictable, monotonic tuning and can limit the tuning range of the laser. In some examples, interfacial reflections can be caused by gaps in the electrodes located on the laser ridge or other discontinuities along the length of the laser waveguide. In some examples, the optical phase mismatch in the laser cavity can be due to the overlap of the Fabry-Perot modes of the gain region located between the grating sections with the reflection spectra of the grating sections.

For example, Vernier effect DBR laser 200 can have gain section 230, grating sections 232 and 234, and phase section 236, electrically separated from one another. Breaks in the metal electrodes can cause fractioning of the laser into multiple sections within the optical mode and can lead to partial light reflection at the interface or boundaries between the sections. These light reflections can lead to increased mode competitions (e.g., mode hopping or multi-mode operation) and can create feedback at unwanted wavelengths, resulting in unpredictable behavior. As illustrated in FIG. 3B, the emission wavelengths can comprise a plurality of channels 365. As discussed above, each channel 365 can correspond to a range of wavelengths around a single peak where tuning can be achieved by simultaneously adjusting both gratings. Within each channel, the common-mode tuning current 369 can increase, as illustrated in arrows in FIG. 3B, without changing the difference in tuning currents, but shifting the emission wavelength. Non-monotonic tuning behavior and/or unpredictable performance can lead to a decrease range of wavelengths over which single mode emission can be reliably achieved, a need for extensive post-manufacturing characterization of the unit, and/or stringent stabilization/control requirements during operation of the laser to account for the non-monotonic tuning relationship.

To overcome or alleviate the problem of mode hopping and multi-mode operation, the Vernier effect DBR laser can be uniformly pumped and tuning of the gratings can be accomplished using nearby tuning or heating elements.

FIGS. 4A-4B illustrate a top and longitudinal view of an exemplary uniformly pumped Vernier effect SG-DBR laser with integrated tuning elements according to examples of the disclosure. Uniformly pumped Vernier effect DBR laser 400 can comprise electrodes 423 and 428, substrate 410, cladding layers 412, insulating cladding (not shown), and active region 414. Uniformly pumped Vernier effect SG-DBR laser 400 can also comprise grating sections 432 and 434. Grating section 432 can include diffraction gratings with a spacing 462 between periods. Grating section 434 can include diffraction gratings with a spacing 464 between periods, where spacing 462 can be different from spacing 464. In some examples, the length or area of grating section 432 can be different from the length or area of grating section 434.

Trench 442 can be formed to constrict current flow so that, in conjunction with an injected tuning current, heat can build up in the nearby active region of the laser. Vernier effect DBR laser 400 can include electrodes 422 and 424 coupled to one or more sources for injecting the tuning currents. Electrode 423 can be disposed on the diffraction gratings and active region and can be coupled to a source for injecting the laser with a pump current. In some examples, the same source can be coupled to some or all of the electrodes 422, 423, and 424. Examples of the disclosure include, but are not limited to, altering the refractive index of the diffraction gratings through heating, plasma dispersion effects, electro-optic effects, or a combination.

Although FIG. 4A illustrates a trench that is rectangular in shape, examples of the disclosure can include trenches formed of any shape. Additionally or alternatively, the geometric parameters of the trench or integrated tuning element can be based on the targeted electrical resistance or the targeted temperature profile in each section or between sections or electrodes. In some examples, Vernier effect DBR laser 400 can include a plurality of trenches, where the trench between electrode 422 and electrode 423 can have different electrical or physical characteristics (or both) than the trench between electrode 424 and electrode 423. In some examples, trench 442 can be formed along the length of the laser. In some examples, trench 442 can be located between electrode 423 and only one of the electrodes 422 or 424.

In some examples, electrode 423 can be a single electrode located on the active region and at least one of the grating sections to allow uniform electrical pumping of one or more sections of the laser cavity. In some examples, the length of electrode 423 can be substantially equal to the length of Vernier effect DBR laser 400 and can allow uniform pumping of the entire laser cavity. This is unlike Vernier effect DBR laser 300 where tuning may require independent injection of currents through a separate electrode for each section. With a single electrode that is absent from any interfaces, discontinuities, or boundaries overlapping the optical mode, unwanted internal reflections can be reduced or eliminated. That is, multi-mode operation, mode hopping, and non-monotonic wavelength shifts with change in tuning current can be eliminated or reduced. While the electrodes for the grating sections (e.g., electrodes 422 and 424 of FIG. 4A) can be placed within the vicinity of the single electrode (e.g., electrode 423), the electrodes can be located anywhere such that there is no or substantially less overlap within the optical mode.

In some examples, the single electrode can lead to a change in the waveguide propagation loss. In some examples, the uniformly pumped Vernier effect DBR laser 400 can lead to a wider distribution or spread of the accessible emission modes from the center of the gain spectrum. In some examples, the uniformly pumped Vernier effect DBR laser 400 can have a greater number of regions in which the emission wavelength does not monotonically increase or decrease when the difference in tuning current is changed.

In some examples, fine-tuning of the emission wavelength can be achieved by simultaneous adjustment of electrodes 422 and 424 such that the overlapping peaks of the reflection spectra $R_1$ and $R_2$ move together. In some examples, Vernier effect DBR laser 400 can be capable of continuous optical tuning over a wavelength by only changing the pump current. As a result, the tuning sensitivity and tuning speed can be improved.

Figure 4C:
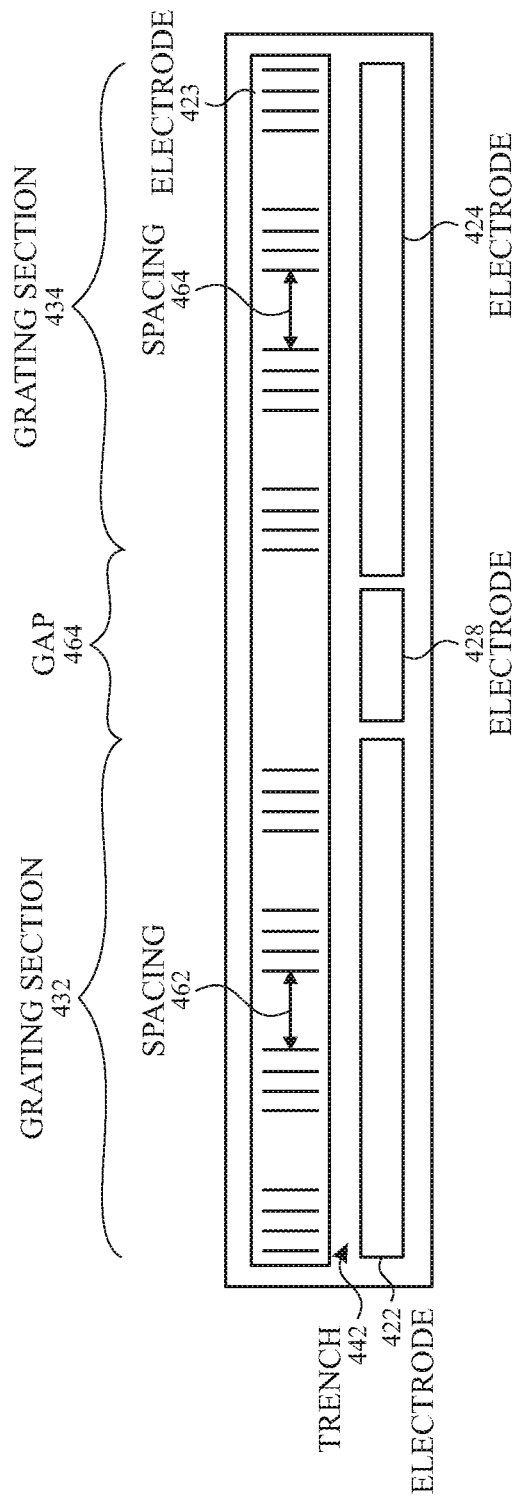
FIG. 4C illustrates a top view of an exemplary uniformly pumped Vernier effect SG-DBR laser including integrated tuning elements according to examples of the disclosure.

In some examples, the grating sections can be separated by a gap, as illustrated in FIG. 4C. Grating sections 432 and 434 can be separated by a gap 464. Electrode 423 can be a single electrode having one or more of the properties described above. In some examples, gap 464 can include a phase section. Electrode 429 can be coupled to the phase section to change or control the overall optical length to maximize output power or fine-tune the wavelength up to the longitudinal cavity mode spacing.

Examples of the disclosure are not limited to a uniformly pumped Vernier effect DBR laser including SGs, but can also include any comb DBR grating design. Exemplary comb DBR grating designs can include, but are not limited to, phase-gratings, SSGs, and BSGs.

Figure 4D:
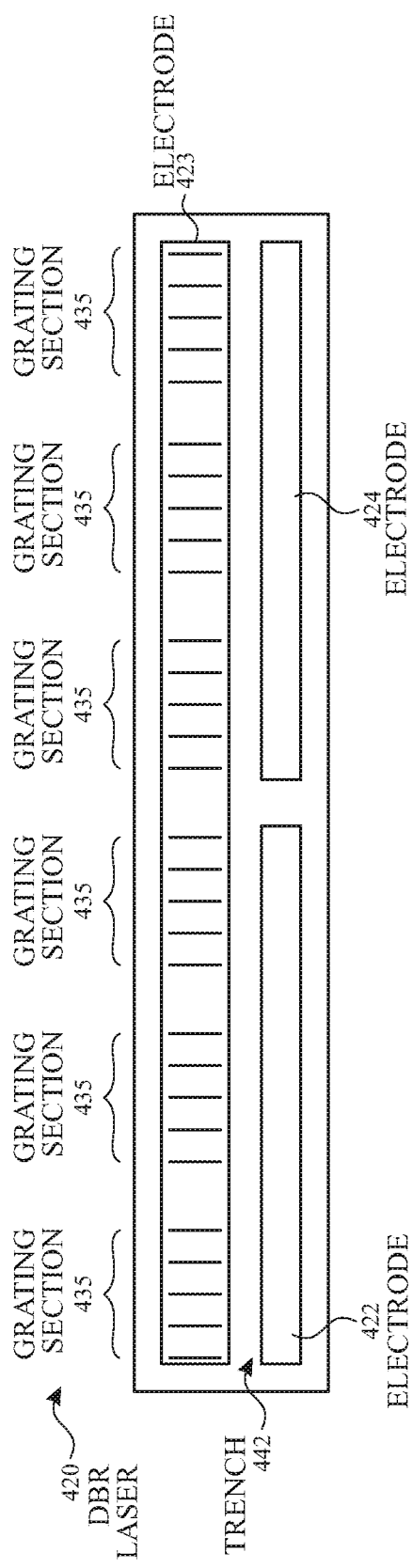
FIGS. 4D-4E illustrate top and longitudinal views of an exemplary uniformly pumped phase-reversal gratings Vernier effect DBR laser with integrated tuning elements according to examples of the disclosure.
Figure 4E:
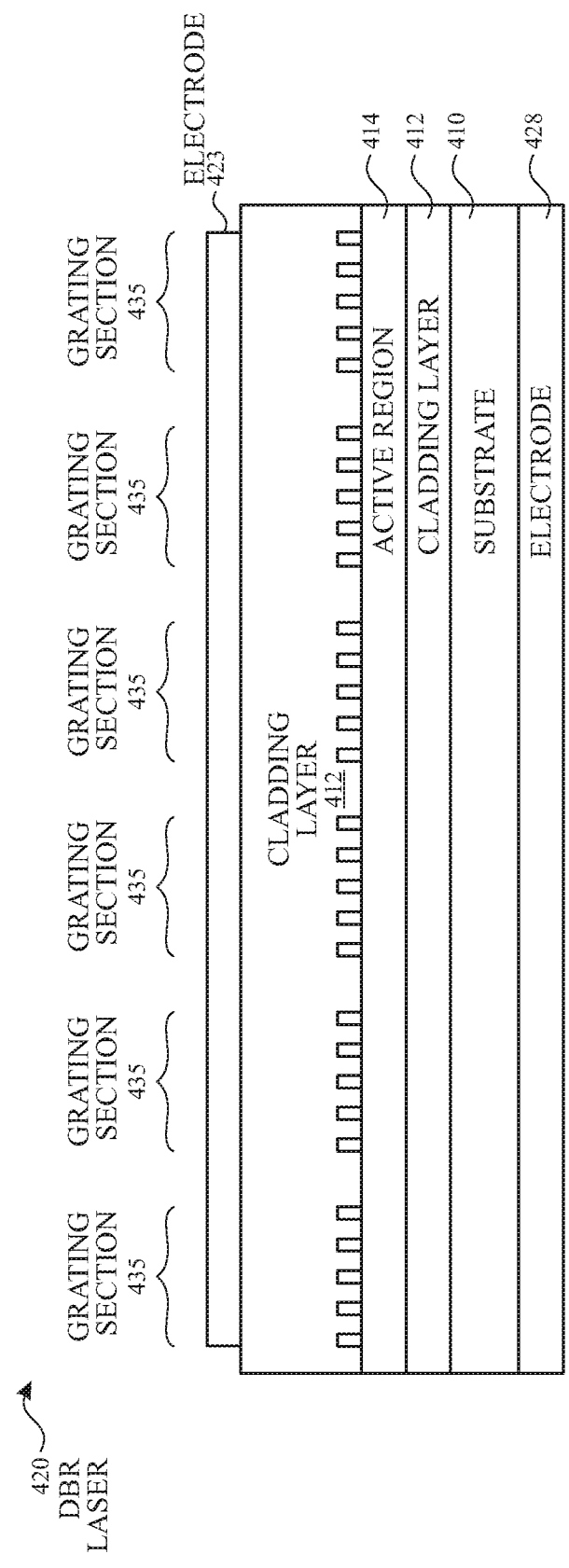

While the SG design is straightforward, the grating duty cycle can be low leading to a possible need for a long reflector or a deep etch of the gratings. One grating design that can lead to a higher grating duty cycle can be a phase reversal grating. FIGS. 4D-4E illustrate top and longitudinal views of an exemplary uniformly pumped phase-reversal gratings Vernier effect DBR laser with integrated tuning elements according to examples of the disclosure. Uniformly pumped phase-reversal gratings Vernier effect DBR laser with integrated tuning elements 420 can comprise electrodes 422-424 and 428, substrate 410, cladding layers 412, and active region 414. The phase reversal gratings can comprise of one or more grating sections 435 formed by multiplying the grating sections by several phase reversal sequences with different periods.

Figure 4F:
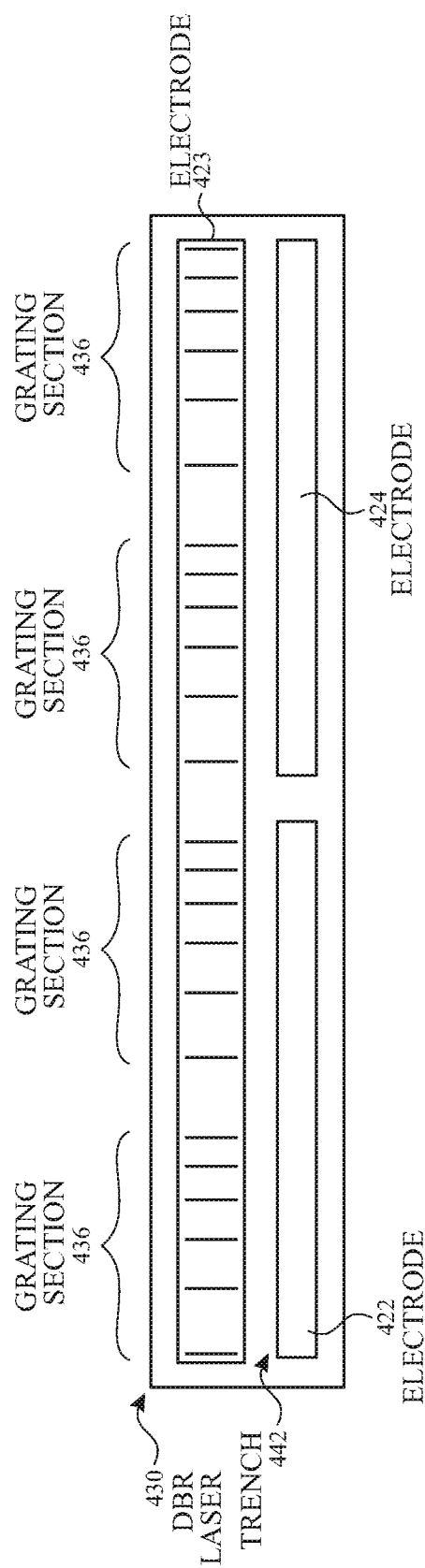
FIGS. 4F-4G illustrate top and longitudinal views of an exemplary uniformly pumped Vernier effect SSG-DBR laser with integrating tuning elements according to examples of the disclosure.
Figure 4G:
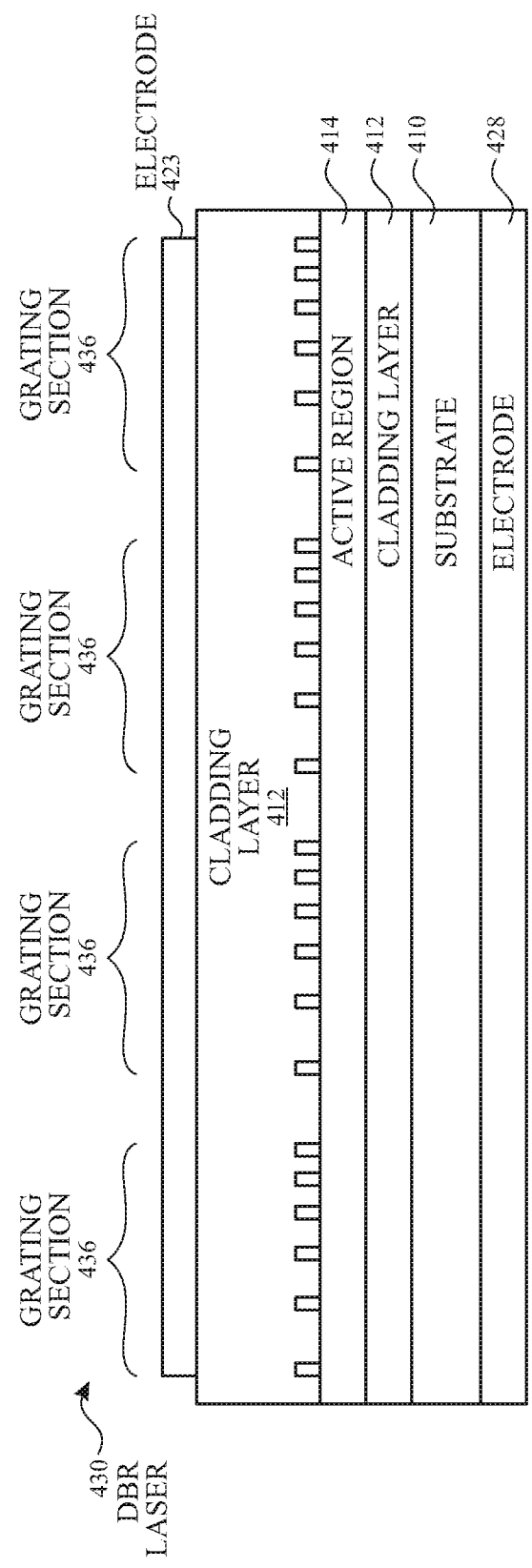

Although the phase-reversal gratings design can achieve a high grating duty cycle, it can be difficult to achieve uniformly spaced combs in the reflectance spectrum. One grating design that can achieve uniformly spaced combs can be SSGs. FIGS. 4F-4G illustrate top and longitudinal views of an exemplary uniformly pumped Vernier effect SSG-DBR laser with integrating tuning elements according to examples of the disclosure. Uniformly pumped Vernier effect SSG-DBR laser with integrated tuning elements 430 can comprise electrodes 423 and 428, substrate 410, cladding layers 412, insulting cladding (not shown), and active region 414. The SSGs can be formed by dividing the length of the laser into one or more grating sections 436, where the periodicity of the gratings can be modulated within each section. In some examples, the periodicity of the gratings can be modulated linearly (i.e., linear chirp). In some examples, the periodicity of the gratings can be modulated according to a stepwise function.

Figure 4H:
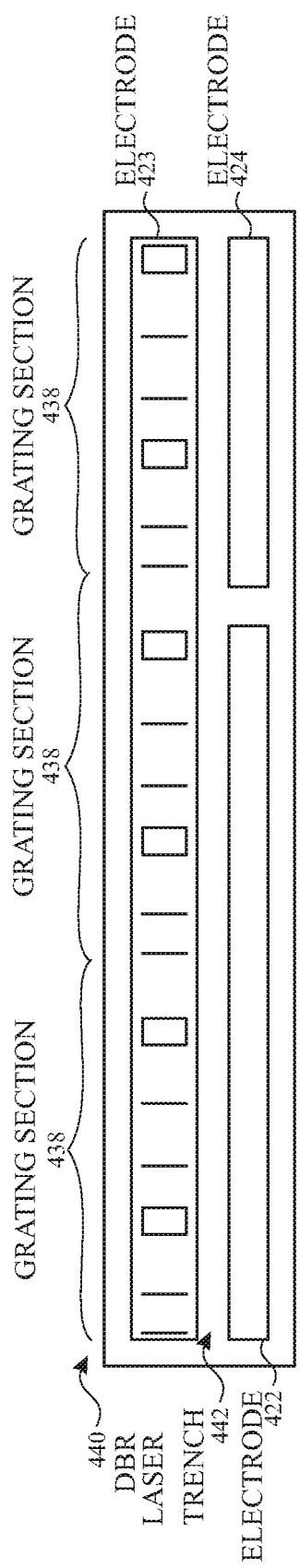
FIGS. 4H-4I illustrate top and longitudinal views of an exemplary uniformly pumped Vernier effect BSG-DBR laser with integrated tuning elements according to examples of the disclosure.
Figure 4I:
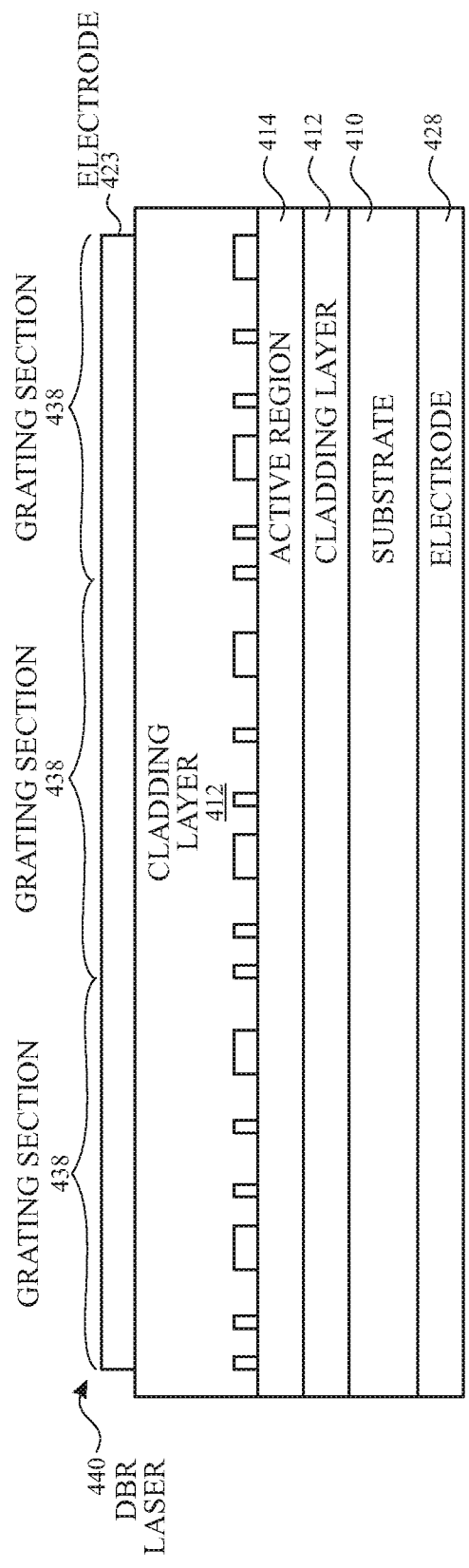

FIG. 4H-4I illustrate top and longitudinal views of an exemplary uniformly pumped Vernier effect BSG-DBR laser with integrated tuning elements according to examples of the disclosure. Uniformly pumped Vernier effect BSG-DBR laser with integrated tuning elements 440 can comprise electrodes 423 and 428, substrate 410, cladding layers 412, insulating cladding (not shown), and active region 414. The uniformly pumped Vernier effect BSG-DBR laser with integrated tuning elements 440 can be comprise one or more grating sections 438, where each section can comprise multiple gratings superimposed in an analog manner, and subjected to a binary digitization. The result of superimposing the multiple gratings can be gratings that looks like an irregular digital sequence (e.g., 10100110100100110). To achieve spectral uniformity, the phase and amplitude of each grating component can be chosen using a numerical optimization procedure. The numerical optimization procedure can be followed by a pattern search to adjust the individual grating amplitude and phase components.

Although examples of the disclosure refer to a Vernier effect DBR laser, examples of the disclosure can be applicable to Distributed Feedback (DFB) lasers, Quantum Cascade Lasers (QCL), Interband Cascade Lasers (ICL), Type-I lasers, or any laser emitting in the near- or mid-infrared (IR).

Figure 4J:
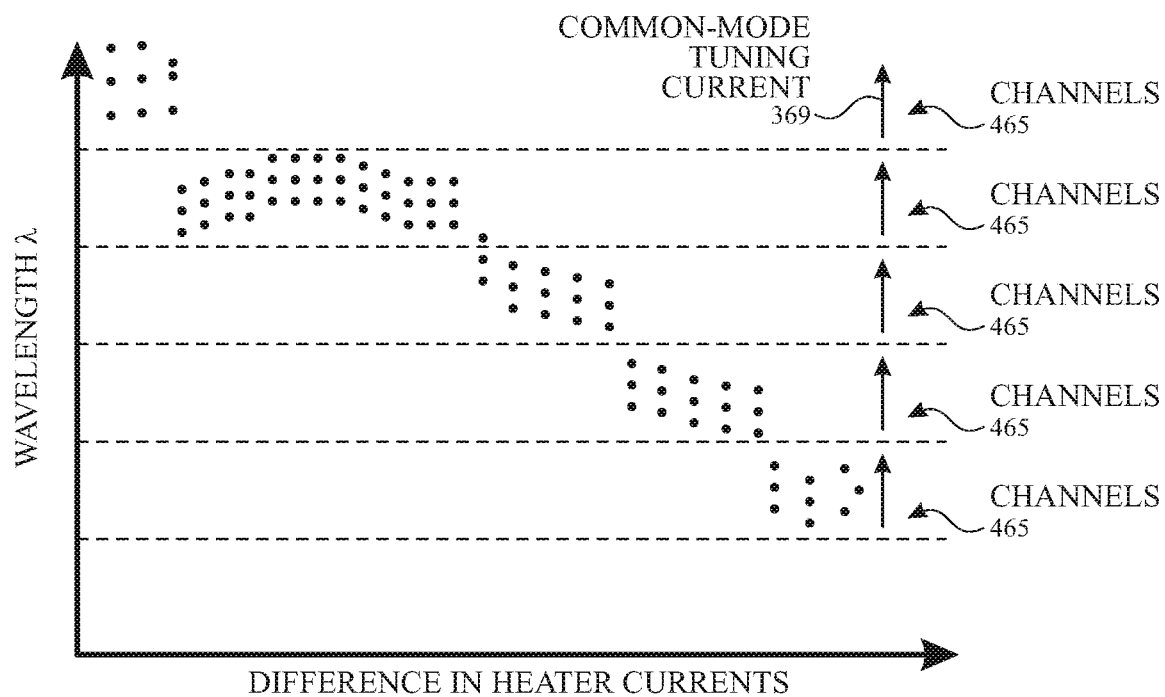
FIG. 4J illustrates an exemplary plot of emission wavelength with varying differences in tuning currents of the grating sections of a uniformly pumped Vernier effect DBR laser including integrated tuning elements according to examples of the disclosure.

FIG. 4J illustrates an exemplary plot of emission wavelength with varying differences between tuning currents of the grating sections of a uniformly pumped Vernier effect DBR laser including integrated tuning elements according to examples of the disclosure. By forming a trench in the Vernier effect DBR laser and heating the gratings through one or more tuning currents, a larger temperature range can be achieved because limitations due to lasing within the grating section(s) or dominating losses may no longer be an issue when the laser active region is uniformly pumped. With a larger temperature range, the laser can be capable of a wider stable tuning range. Furthermore, the difference between the wavelength spacings (e.g., $\Delta\lambda_1$ and $\Delta\lambda_2$) can be made larger because of the larger accessible temperature range. The larger difference between the wavelength spacings can decrease the tendency of the laser to emit light at an undesired wavelength due to the decrease in overlap of reflectance peaks adjacent to the target reflectance peak. For example, as illustrated in FIG. 2D, peaks 273 and 284 overlap to form peak 294. The overlap between peaks, such as peaks 274 and 285, adjacent to the target reflectance peak, such as peak 294, can be smaller if $\Delta\lambda_1$, $\Delta\lambda_2$, and the difference $|\Delta\lambda_1 - \Delta\lambda_2|$ are larger.

Additionally, direct control of the temperature of the diffraction gratings through tuning currents can reduce or eliminate any temperature fluctuations when operated in a closed-loop feedback system. Furthermore, the lack of interfaces or boundaries within the optical mode can reduce or eliminate the multi-mode operation or mode hopping. With fewer temperature fluctuations and less mode hopping, the laser performance can be more predictable, and a relationship between tuning currents and emission wavelength can be extracted, as illustrated in the figure.

Figure 5A:
FIGS. 5A-5I illustrate cross-sectional views of exemplary stackups for fabrication of an exemplary uniformly pumped Vernier effect DBR laser including integrated tuning elements according to examples of the disclosure.
Figure 5B:
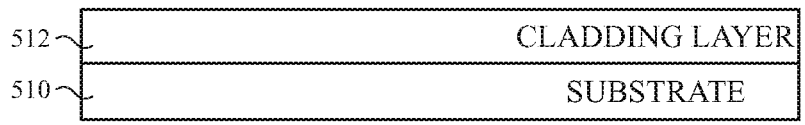
Figure 5C:
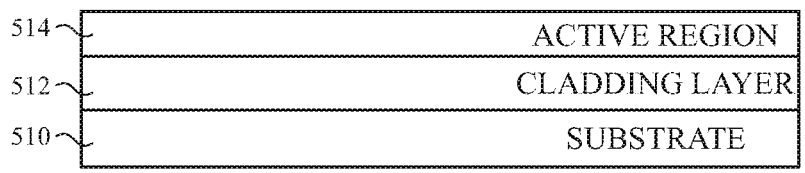
Figure 5D:
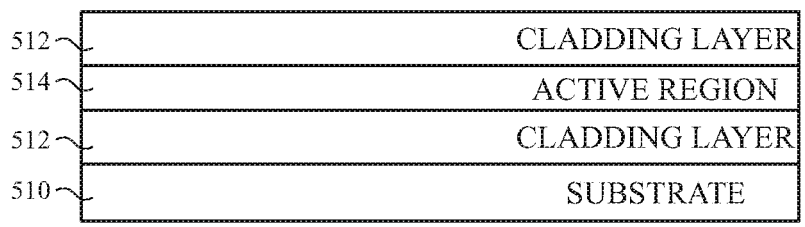
Figure 5E:
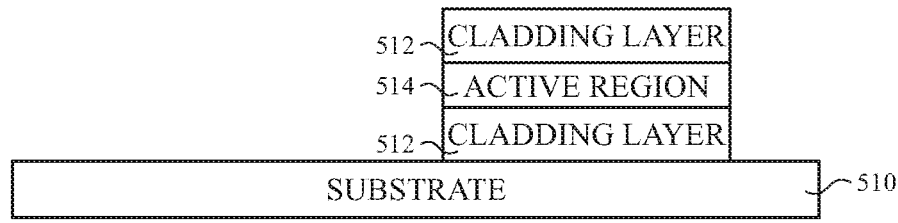
Figure 5F:
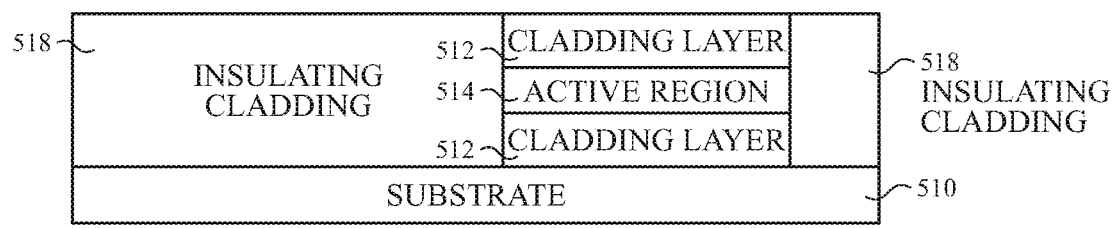
Figure 5G:
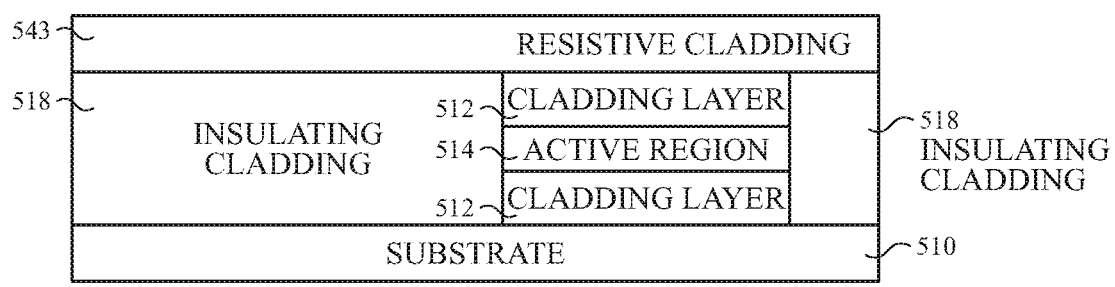
Figure 5H:
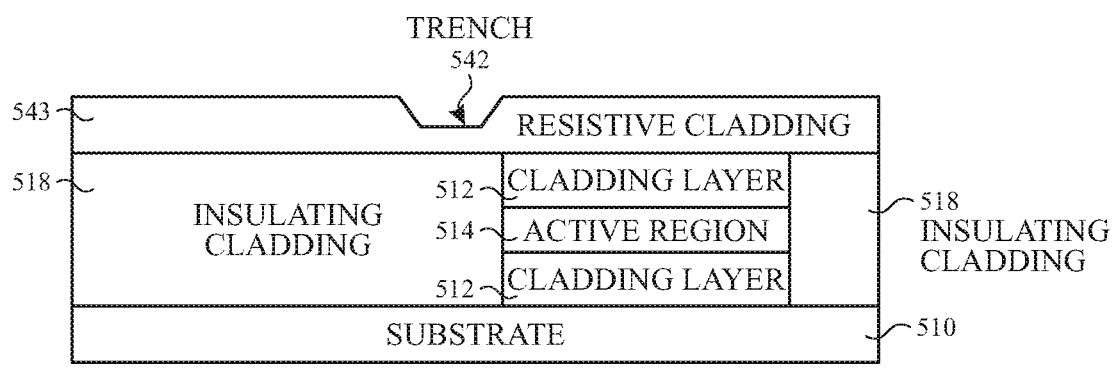
Figure 5I:
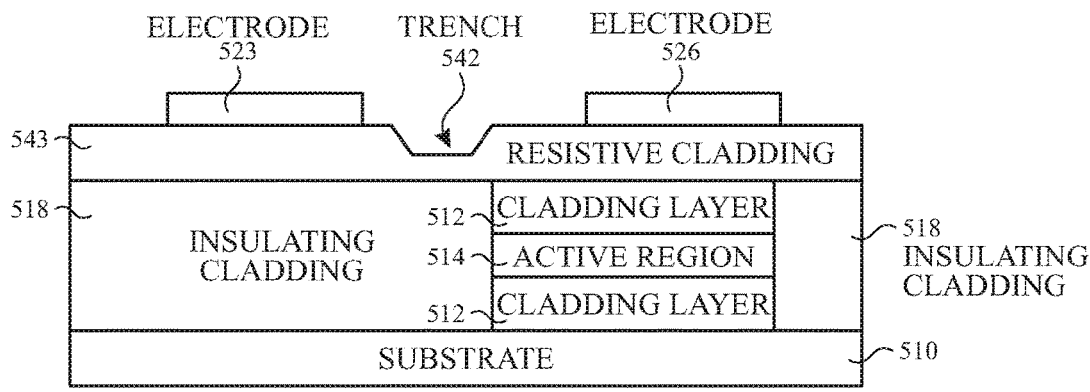
Figure 5J:
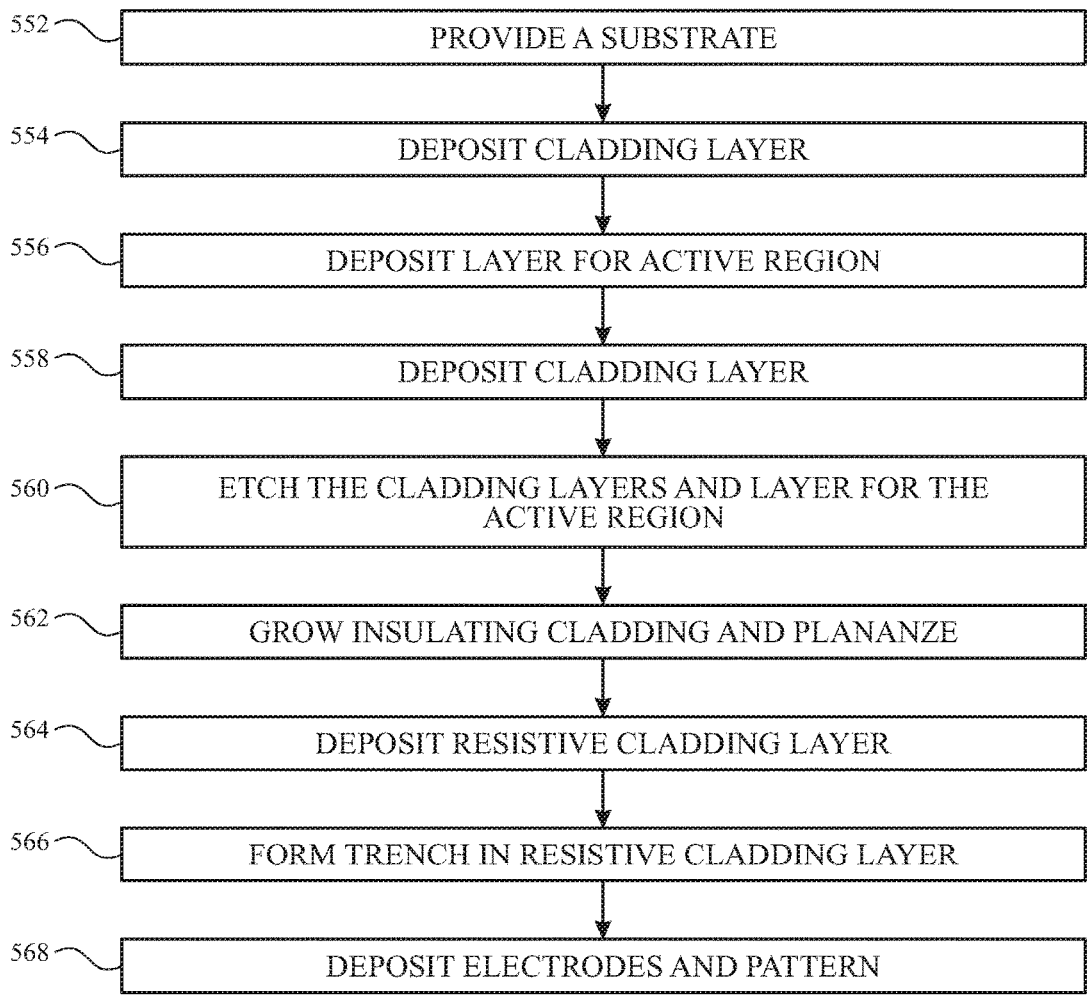
FIG. 5J illustrates an exemplary process flow for fabrication of a uniformly pumped Vernier effect DBR laser including integrated tuning elements according to examples of the disclosure.

FIGS. 5A-5I illustrate cross-sectional views of exemplary stackups, and FIG. 5J illustrates a process flow for fabrication of an exemplary uniformly pumped Vernier effect DBR laser including integrated tuning elements according to examples of the disclosure. Process 550 can begin by providing a substrate 510 (step 552), as illustrated in FIG. 5A. Exemplary materials for substrate 510 can include, but are not limited to, InP, GaAs, and GaSb. A first cladding layer 512 can be deposited on substrate 510 (step 554), as illustrated in FIG. 5B. Exemplary materials for the cladding layer 512 can include, but are not limited to semiconductor alloys that are lattice-matched to InP, GaAs, or GaSb. One or more layers for the active region 514 can be deposited (step 556), as illustrated in FIG. 5C. Exemplary materials for the active region 514 can include, but are not limited to, InGaAs/AlInAs, InGaAs/InGaAs, InGaAlAs/InGaAlAs, GaAlSb/InAs, and AlSb/GaSb. Then, as illustrated in FIG.

5D, a second cladding layer 512 can be deposited (step 558). Step 560 can include etching the two cladding layers 512 and the active region 514, as illustrated in FIG. 5E. An insulating or semi-insulating cladding 518 can be formed in the area surrounding the two cladding layers 512 and the active region 514 (step 560), as illustrated in FIG. 5F. Exemplary materials for the insulating cladding layer 518 can include, but are not limited to, Fe-doped InP, GaAs, and GaSb. This step can be followed by a planarization step (step 562). As illustrated in FIGS. 5G-5H, a resistive cladding layer 543 can be deposited (step 564), and then a trench 542 can be formed (step 566). After or before the trench 542 has been formed, electrodes 523 and 526 can be deposited and patterned on the resistive cladding layer 543 (step 568), as illustrated in FIG. 5I. Exemplary materials for the electrodes 523 and 526 can include, but are not limited to, Au, Ti/Au, Cr/Au, and Al. In some examples, there can be one or more layers in between the resistive cladding layer 543 and electrodes 523 and 526.

One skilled in the art would understand that the one or more layers described above and below can be deposited using any number of techniques including, but not limited to, screen printing, spin-on coating, spray coating, roll-to-roll coating, physical vapor deposition, chemical vapor deposition, epitaxial growth, or other suitable deposition techniques. Additionally, the one or more layers described above and below can be etched using any number of patterning techniques, including, but not limited to, laser ablation, chemical acid etching, dry etching, shadow masking, electron-beam lithography, and photolithography/resist processes. Although FIGS. 5A-5I illustrates the cladding layer, insulating cladding layer, resistive cladding layer, and each electrode as a single layer, examples of the disclosure can include each layer comprising one or more sublayers.

The optical tuning for each grating section can be controlled by either changing the tuning current injected through one or both of the tuning elements or changing the pump current injected in the gain section or both. FIGS. 6A-6D illustrate exemplary reflectance spectra of the grating sections and total optical cavity of a uniformly pumped Vernier effect DBR laser including integrated tuning elements according to examples of the disclosure. Referring back to FIG. 2D, the optical cavity reflectance OCR 261 can include peak 294 due to peak 273 of $R_1$ overlapping with peak 284 of $R_2$. Peak 694 can be representative of peak 294.

Figure 6A:
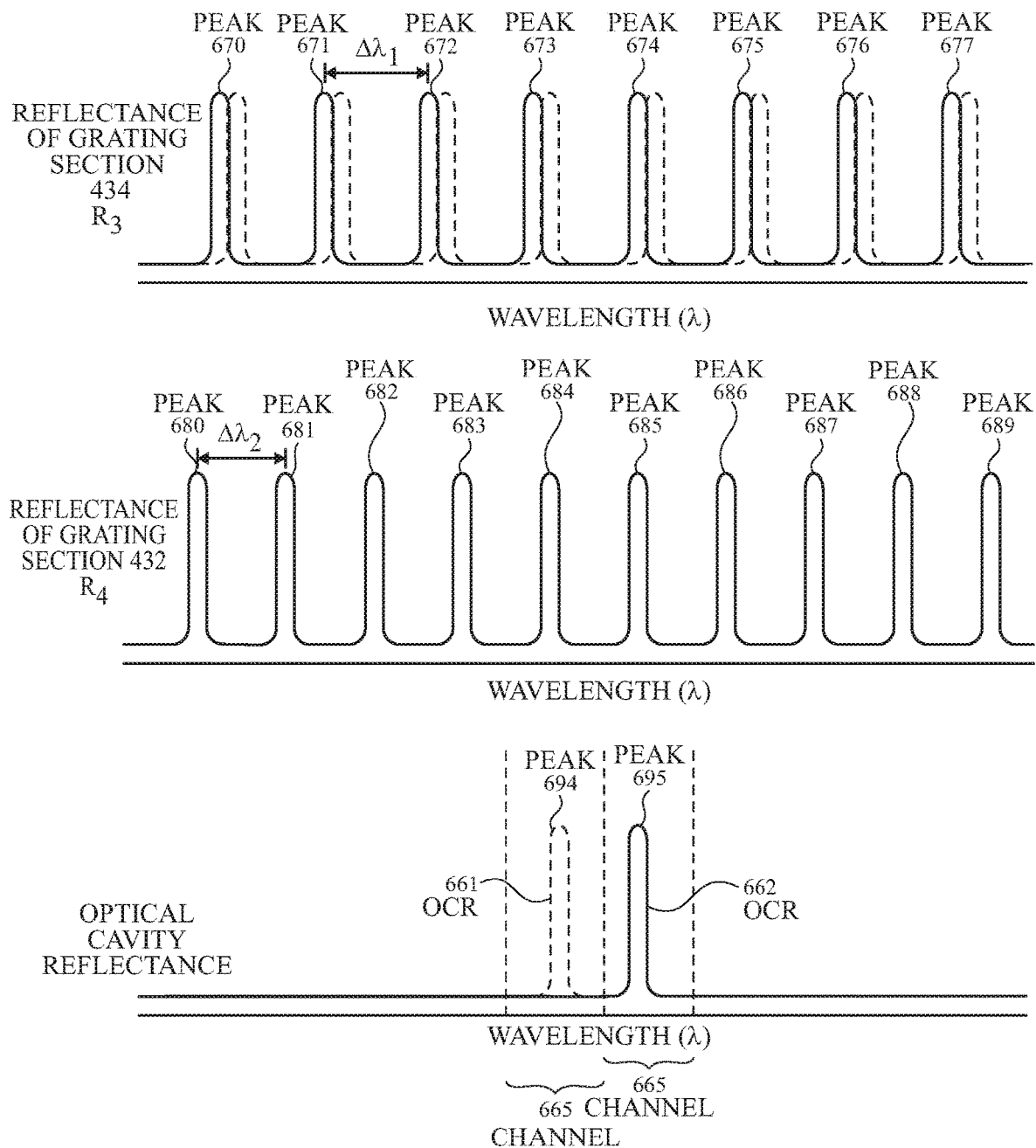
FIGS. 6A-6D illustrate exemplary reflectance spectra of the grating sections and total optical cavity of a uniformly pumped Vernier effect DBR laser including integrated tuning elements according to examples of the disclosure.

As shown in FIG. 6A, the tuning current injected into electrode 422 can be changed to cause a shift in the reflectance spectrum of grating section 432, shown as reflectance spectrum $R_3$. In some examples, the tuning current injected into electrode 424 can remain the same to produce the reflectance spectrum of grating section 434, shown as $R_4$. Changing the tuning current injected into electrode 422 and maintaining the tuning current injected into electrode 424 can lead to peak 674 overlapping with peak 685 of $R_4$ to produce peak 695. Peaks 694 and 695 can be located in different channels 665. As shown in the figure, OCR 661 (which is similar to OCR 261 of FIG. 2D) is overlaid next to OCR 662 to illustrate that changing the current injected into one of the electrodes (e.g., electrode 424) and maintaining the current injected into the other electrode (e.g., electrode 424) can change the emission wavelength.

Figure 6B:
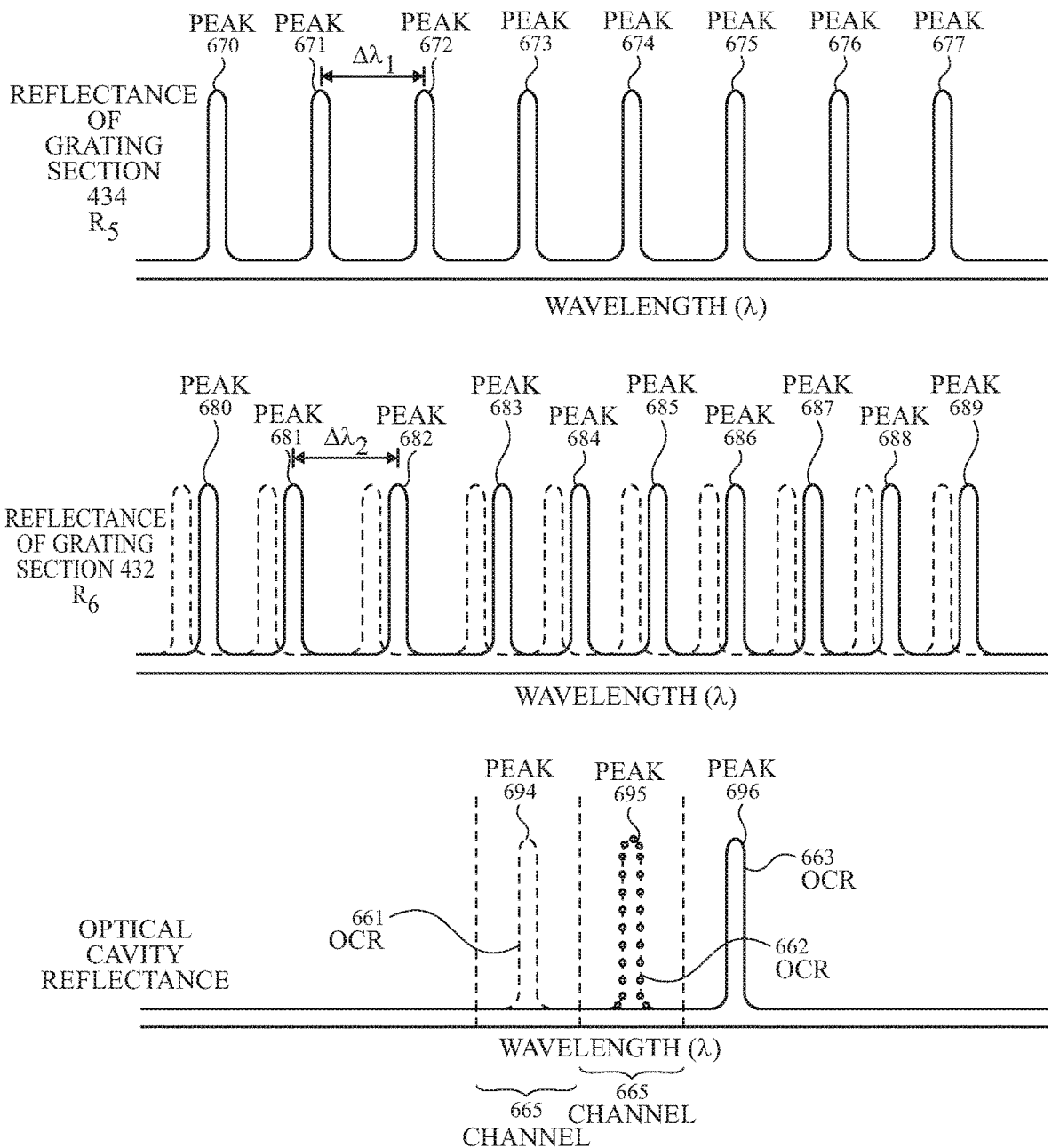

FIG. 6B illustrates exemplary reflectance plots when the current injected into the second electrode (e.g., electrode 424) is changed, while the current injected into the first electrode (e.g., electrode 422) is fixed according to examples of the disclosure. The change in current injected into electrode 424 can cause a shift in the reflectance spectrum $R_6$ (compared to reflectance spectrum $R_4$ of FIG. 6A) of grating section 434, whereas maintaining the current injected into electrode 422 can cause the reflectance spectrum $R_5$ of grating section 432 to remain the same (as reflectance spectrum $R_3$ of FIG. 6A). The resulting optical cavity reflectance OCR 663 can include peak 696 formed by overlapping peaks 675 and 686.

Figure 6C:
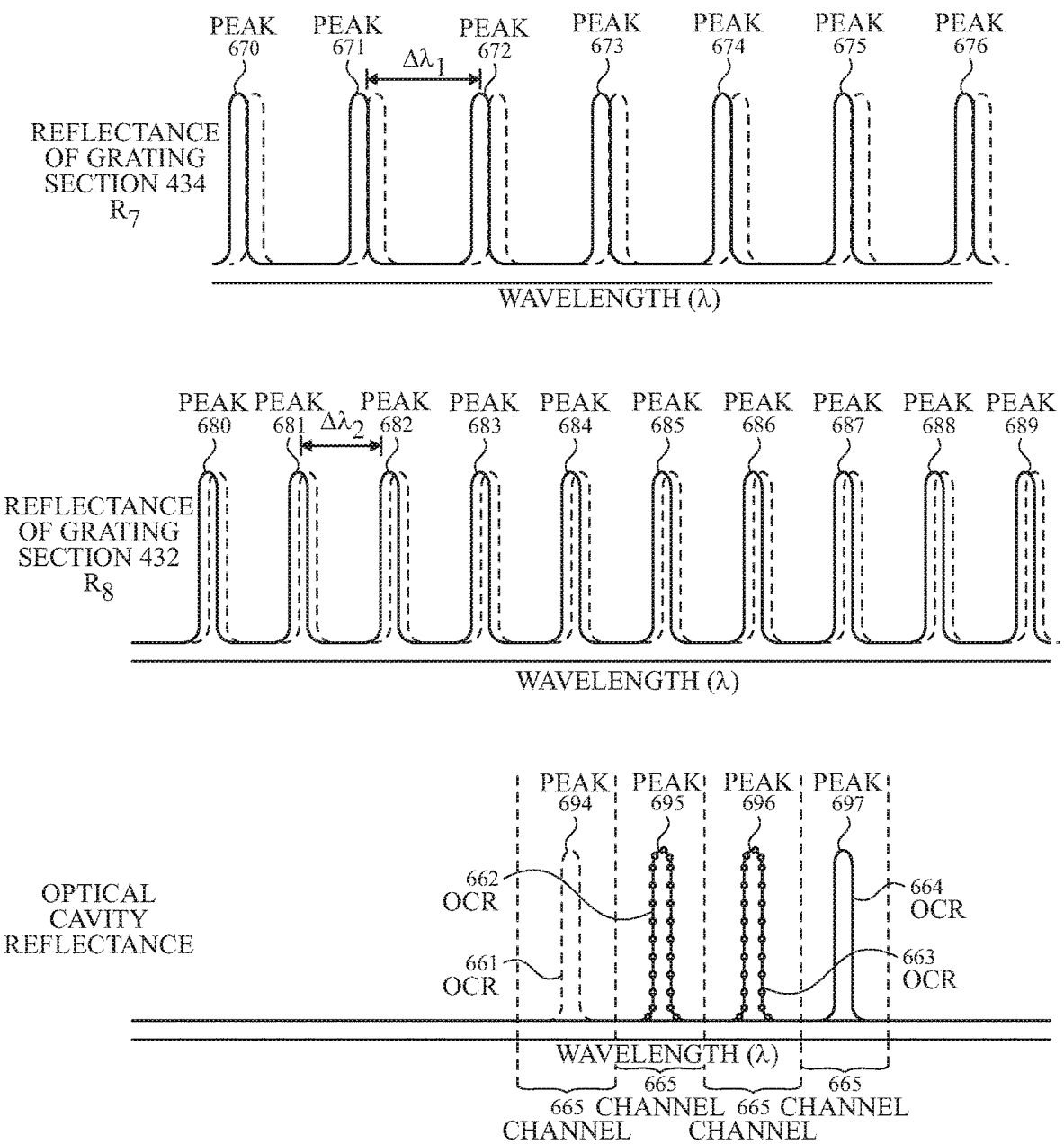

In some examples, the tuning current injected into both electrodes can be changed, as illustrated in FIG. 6C. The tuning current injected into electrode 424 can be adjusted at the same time or shortly before (or after) the tuning current injected into electrode 422 is changed. The simultaneous change in tuning current can cause a shift of both reflectance spectra $R_7$ and $R_8$ (compared to reflectance spectra $R_5$ and $R_6$ of FIG. 6B). This shift can result in an optical cavity reflectance OCR 664 with peak 697 formed by overlapping peaks 675 and 687.

Figure 6D:
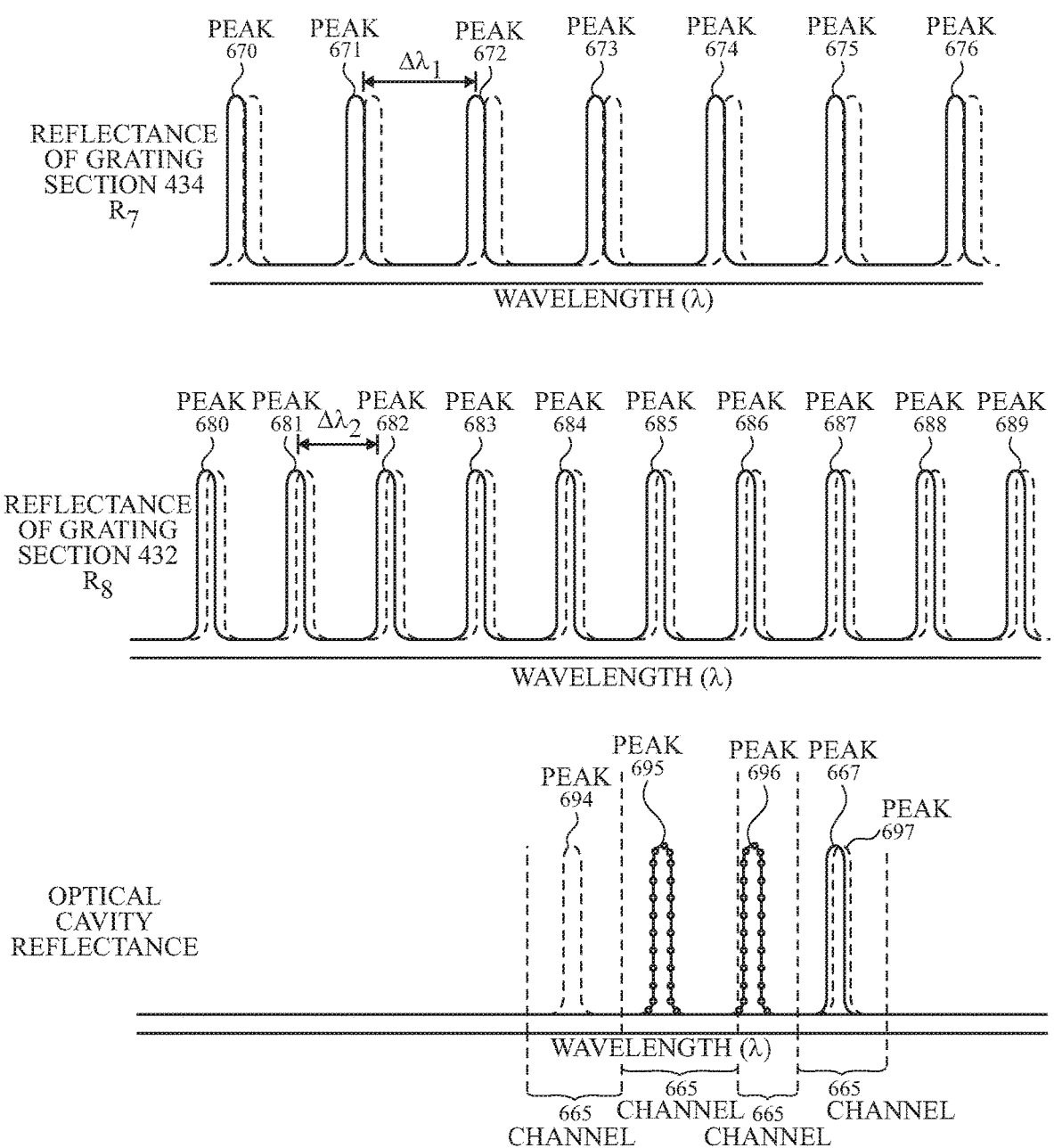

As illustrated in FIGS. 6A-6C, the laser emission wavelength can be changed by changing the current injected into one or more electrodes due to a change in the temperature and refractive index of the diffraction gratings. Additionally or alternatively, the tuning currents value, as illustrated by the arrow in FIG. 4D, can be changed to change the emission wavelength within a channel. For example, as illustrated in FIG. 6D, the laser can emit at a wavelength illustrated by peak 667 due to a change in the common-mode heater current, but without a change in the difference of the tuning currents.

The above-disclosed uniformly pumped Vernier effect DBR laser including integrated tuning elements can be tuned using a number of techniques. In some examples, the uniformly pumped Vernier effect DBR laser can be tuned by accessing a look-up table. The look-up table can include a plurality of emission wavelengths and corresponding drive currents and tuning element currents.

Figure 7:
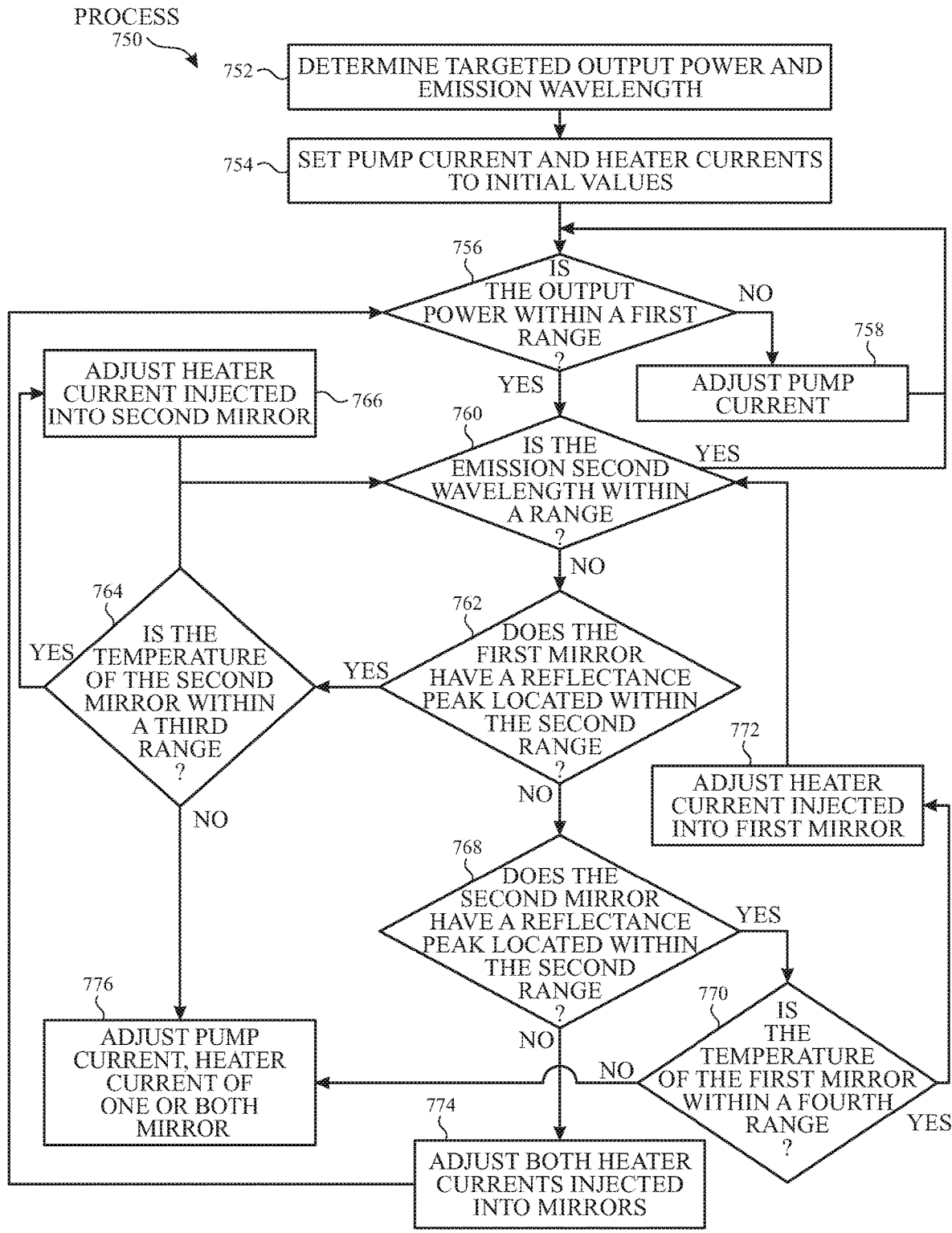
FIG. 7 illustrates an exemplary flow diagram for continuous tuning of a uniformly pumped Vernier effect DBR laser including integrated tuning elements according to examples of the disclosure.

In some examples, the drive currents and tuning element currents can be determined while the laser is in operation. FIG. 7 illustrates an exemplary process flow diagram for tuning of a uniformly pumped Vernier effect DBR laser including integrated tuning elements according to examples of the disclosure. Process 750 can begin with determining the targeted laser output power and emission wavelength (step 752). The pump currents and tuning currents can be set to initial values (step 754). In some examples, the initial values can be based on predetermined values stored in memory. The output power of the laser can be measured, and a controller or a processor can determine whether the output power is within a first range (step 756). If the output power is not within a first range, the pump current can be adjusted until the output power is within that first range (step 758). The emission wavelength can also be measured, and the controller or processor can determine whether the emission wavelength is within a second range (step 760). In some examples, the second range can be associated with the targeted emission wavelength.

If the emission wavelength is not within the second range, the controller can determine whether the first DBR grating section (mirror) has a reflectance peak located within the second range (step 762). If so, the reflectance spectrum of the first mirror may not need to be shifted. The controller can determine whether the temperature of the second mirror is within a third range (step 764), and if within the third range, the tuning current injected into the second mirror can be adjusted (step 766). If the temperature of the second mirror is not within the third range, then one or more currents, other than the tuning current injected into the second mirror may need to be adjusted (step 776).

In some examples, it may be desirable to shift the reflectance spectrum of the first mirror for any number of reasons including, but not limited to, to align one or more reflectance peaks to match the emission wavelength or to be able to change other operating parameters. The controller can determine whether the second mirror has a reflectance peak located within the second range (step 768). When the second mirror has a reflectance peak located within the second range, the reflectance spectrum of the second mirror may not need to be shifted. The controller can determine whether the temperature of the first mirror is within a fourth range (step 770), and if within the fourth range, the tuning current injected into the first mirror can be adjusted (step 772). If the temperature of the first mirror is not within the fourth range, then one or more currents, other than the tuning current injected into the first mirror, may need to be adjusted (step 776).

In some examples, the tuning currents injected into both mirrors may be adjusted (step 774). By adjusting the currents injected into both mirrors, the reflectance spectrum of both mirrors can be shifted. For example, if the controller determines that the laser is emitting at the targeted emission wavelength, but wants to fine-tune this wavelength, the currents injected into both mirrors can be adjusted. In some examples, the adjustments can occur simultaneously, and in some examples, the adjustments can occur at different times. In some examples, the laser can include a phase section, and the phase section can be adjusted to fine-tune the emission wavelength between longitudinal cavity modes. In some examples, the mirror currents can be coupled to the same source. In some examples, the pump current can be adjusted additionally or alternatively to the one or more mirror currents.

In some examples, the first and second ranges can be based on the application or the system that the laser is integrated into. In some examples, the third and fourth ranges can be based on the characteristics of the laser, such as the type of materials used in the layers of the stackup of the laser. While the term "range" can include a plurality of values, the examples of the disclosure are not limited to this, and the term "range" can include a singular value.

Figure 8:
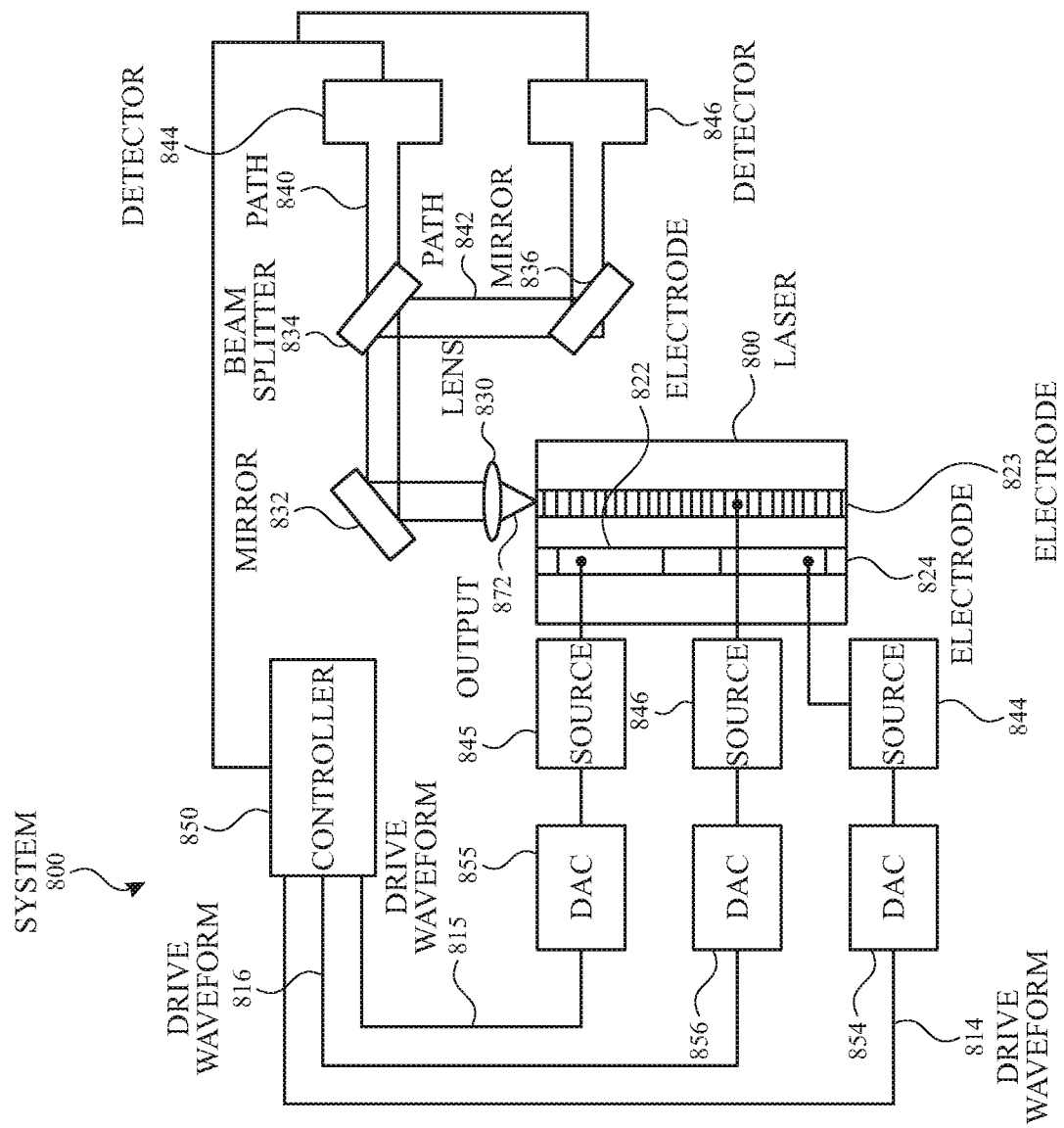
FIG. 8 illustrates an exemplary system comprising a uniformly pumped Vernier effect DBR laser including integrated tuning elements according to examples of the disclosure.

FIG. 8 illustrates an exemplary system comprising a uniformly pumped Vernier effect DBR laser including integrated tuning elements according to examples of the disclosure. Laser 800 can include a plurality of electrodes 822-824. Electrodes 822 and 824 can be coupled to tuning elements, and electrode 823 can be coupled to the laser cavity.

One or more sources can be coupled to the electrodes to inject either a pump current or a tuning current. For example, source 845 can be coupled to electrode 822 to inject a tuning current in a first grating section, source 844 can be coupled to electrode 824 to inject a tuning current in a second grating section, and source 846 can be coupled to electrode 823 to inject a pump current into the laser cavity. The output 872 of laser 800 can be directed at lens 830, which can reflect off mirror 832. Beamsplitter 834 can split the optical beam into two different paths 840 and 842. Path 840 can be directed at detector 844. Path 842 can be directed at mirror 836, which can reflect the light to detector 846. Detector 844 can measure the laser output power, and detector 846 can measure emission wavelength. In some examples, only one detector can be used to measure both output power and emission wavelength. In some examples, an etalon can be included in path 842 between mirror 836 and detector 846. In some examples, an optical spectrometer can be used to measure the emission wavelength of the laser. The signals from detectors 844 and 846 can be inputted to a computer or controller 850.

Controller 850 can include a memory to store one or more of the initial values, predetermined values, and ranges. The controller 850 can also monitor deviations or measure the differences between the detected signals and targeted signals or response waveform. Based on the deviations or differences, the controller 850 can generate drive waveforms 814-816. Drive waveforms 814-816 can be new waveforms or adjusted waveforms used to minimize or reduce the deviations between targeted and measured values. Digital-to-analog converters (DACs) 854-856 can be coupled to controller 850 and sources 844-846 to convert the signals or waveforms generated by controller 850 from digital to analog signals.

Figure 9:
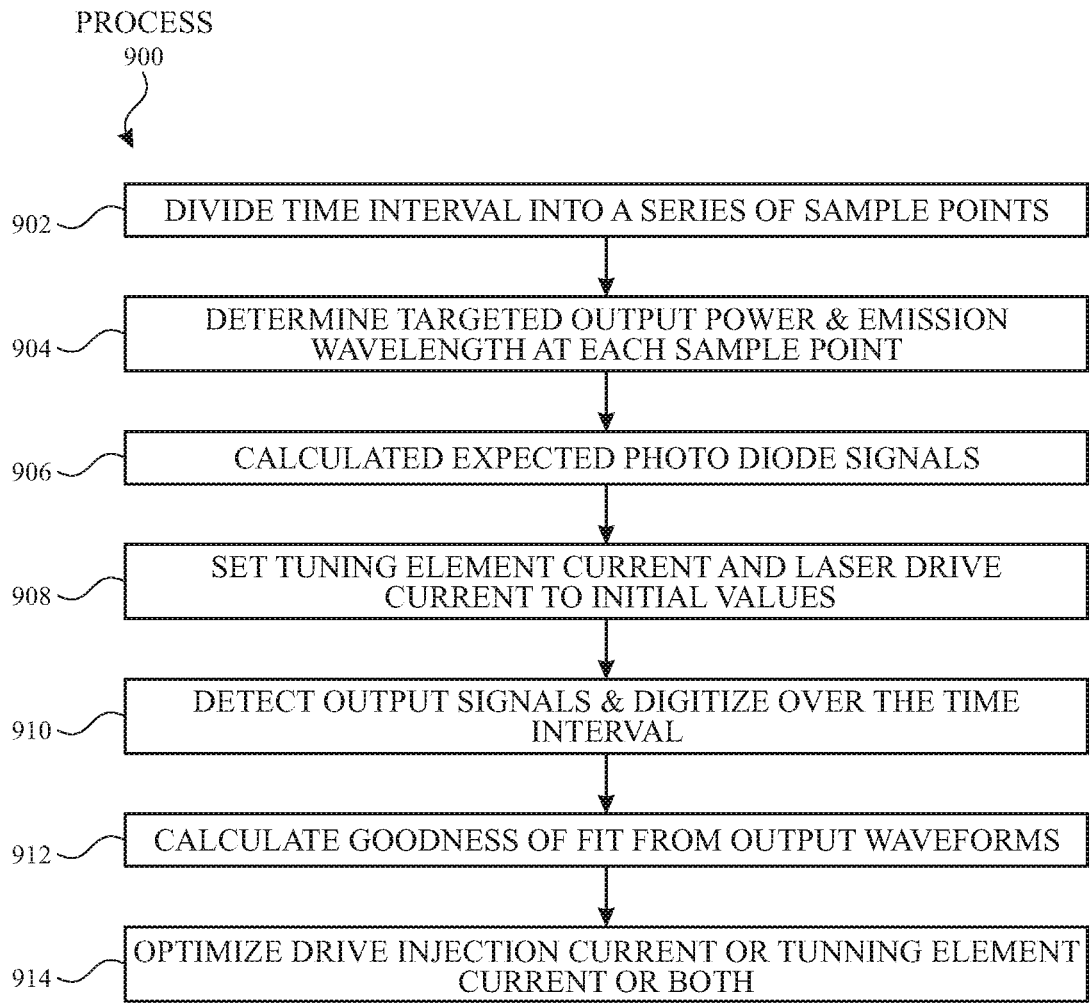
FIG. 9 illustrates an exemplary process flow for optimizing the tuning currents and pump current of a uniformly pumped Vernier effect DBR laser including integrated tuning elements according to examples of the disclosure.

FIG. 9 illustrates an exemplary process flow for optimizing the tuning currents and pump current of a uniformly pumped Vernier effect DBR laser including integrated tuning elements according to examples of the disclosure. Process 900 can begin with dividing a time interval into a series of sample point (step 902). In some examples, process 900 can be performed by a processor or controller (such as controller 850 of FIG. 8). In some examples, the time interval can be based on a repetition period of the desired power and wavelength response waveforms. The controller can determine the target output power and emission wavelength at each sample point (step 904) and from this, can calculate the expected photodiode signals (step 906). The expected photodiode signals can be based on factors such as response curves of the photodiodes, the length of the etalon, the optical properties of the etalon, the response of the spectrometer, or any combination.

The controller can set the tuning element current and laser drive current to initial values (step 908). In some examples, the tuning element can be set to zero, and the laser drive current can be set to a constant value above threshold (i.e., value that the laser is turned on). Alternatively, the laser can be driven using pre-determined waveforms. In some examples, the pre-determined waveforms can be based on previous characterization data from the laser. The pre-determined waveforms can include, but are not limited to, light IV curves for different pump currents and tuning element currents and step responses of pump or tuning current perturbations. The controller or a signal acquisition system can detect the output signals and digitize over the time interval (step 910). In some examples, the time interval can be one time interval. In some examples, the output signals can be signals measured from the detectors, such as detectors 844 and 846 of FIG. 8.

From the output signals or waveforms, the goodness of fit can be calculated (step 912). The goodness of fit (GOF) can be a figure of merit to quantify the difference between the targeted and measured laser outputs or waveforms, including the output powers and emission wavelengths. For example, the GOF can be defined as:

$$GOF = \Sigma_{n=1}^{P} w_1 \times (W(t) - W_T(t))^2 + w_2 \times (P(t) - P_T(t))^2$$

where $W(t)$ is the measured wavelength at time t, $W_T(t)$ is the targeted wavelength at time t, $P(t)$ is the measured output power at time t, $P_T(t)$ is the targeted output power at time t, $w_1$ and $w_2$ are weighted values, and P is the number of sample points in the time interval. Based on the GOF, the controller can optimize the tuning currents or pump current or both (step 914) using, for example, process 700 of FIG. 7.

One or more of the functions described above can be performed, for example, by firmware stored in memory and executed by a processor or controller. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding a signal) that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus, or device, a portable computer diskette (magnetic), a random access memory (RAM) (magnetic), a read-only memory (ROM) (magnetic), an erasable programmable read-only memory (EPROM) (magnetic), a portable optical disc such as a CD, CD-R, CD-RW, DVD, DVD-R, or DVD-RW, or flash memory such as compact flash cards, secured digital cards, USB memory devices, memory sticks and the like. In the context of this document, a "transport medium" can be any medium that can communicate, propagate, or transport the program for use by or in connection with the instruction execution system, apparatus, or device. The transport readable medium can include, but is not limited to, an electronic, magnetic, optical, electromagnetic, or infrared wired or wireless propagation medium.

A semiconductor laser is disclosed. In some examples, the semiconductor laser comprises: a plurality of sections including: two or more grating sections, each grating section including a one or more diffraction gratings, each grating section including a reflection spectrum comprising a plurality of peaks with a wavelength spacing; and one or more tuning sections; an optical gain region; a first electrode disposed on the active region and at least one of the two or more grating sections; and one or more second electrodes, each second electrode disposed on at least one of the one or more tuning sections. Additionally or alternatively to one or more examples disclosed above, in other examples, the semiconductor laser further comprises: a trench located at least partially between the first electrode and at least one of the one or more second electrodes. Additionally or alternatively to one or more examples disclosed above, in other examples, the trench is associated with at least one of the one or more second electrodes, and injection of a current into the at least one of the one or more second electrodes generates heat. Additionally or alternatively to one or more examples disclosed above, in other examples, the two or more grating sections includes a first grating section and a second grating section, and further wherein the wavelength spacing of the first grating section is different from the wavelength spacing of the second grating section. Additionally or alternatively to one or more examples disclosed above, in other examples, the semiconductor laser further comprises a first region located between the first grating section and the second grating section, wherein the first region excludes diffraction gratings. Additionally or alternatively to one or more examples disclosed above, in other examples, the first region includes a phase section, the laser further comprising a third electrode. Additionally or alternatively to one or more examples disclosed above, in other examples, an area of the first grating section is different from an area of the second grating section. Additionally or alternatively to one or more examples disclosed above, in other examples, the semiconductor laser further comprising a second trench different from the trench and associated with a different one of the two or more grating sections. Additionally or alternatively to one or more examples disclosed above, in other examples, the semiconductor laser further comprising at least one of a sampled grating (SG) Distributed Bragg Reflector (DBR), phase-reversal grating DBR, superstructure grating (SSG) DBR, and binary superposition grating (BSG) DBR. Additionally or alternatively to one or more examples disclosed above, in other examples, the laser includes an optical cavity reflectance spectrum comprising a single peak, within an active region gain spectrum of the laser, formed by reflectance peaks from the two or more grating sections that overlap at least partially, wherein the plurality of output peaks excludes an interfacial reflectance. Additionally or alternatively to one or more examples disclosed above, in other examples, each of the one or more tuning sections is a heater or a phase section. Additionally or alternatively to one or more examples disclosed above, in other examples, a length of the first electrode is substantially equal to a length of the laser, wherein the length of the laser is along a direction of light propagation in the optical gain region.

A device is disclosed. The device can comprise: a laser including a plurality of sections including: two or more grating sections, each grating section including one or more diffraction gratings, each grating section including a reflection spectrum comprising a plurality of peaks with a wavelength spacing; and one or more tuning sections; an active region; a first electrode disposed on the active region and at least one of the two or more grating sections; and one or more second electrodes, each second electrode disposed on at least one of the one or more tuning sections; one or more electrical sources, each source coupled to one of the one or more second electrodes; and a controller coupled to the one or more sources and configured to adjust the one or more sources based on at least one of a temperature of one of the two or more grating sections, a temperature of the active region, an emission wavelength, an output power, and a tuning range. Additionally or alternatively to one or more examples disclosed above, in other examples, the laser is a Quantum Cascade Laser (QCL). Additionally or alternatively to one or more examples disclosed above, in other examples, the laser is configured for emitting at an emission wavelength located in the mid-infrared. Additionally or alternatively to one or more examples disclosed above, in other examples, the laser is capable of continuous tuning within a single channel, wherein the single channel corresponds to a range of wavelengths. Additionally or alternatively to one or more examples disclosed above, in other examples, each of the one or more tuning sections is a heater or a phase section.

A method of driving a laser having a waveguide a first tuning element, and a second tuning element is disclosed. The method can comprise: applying a first waveform to the first tuning element to control a first reflectance spectrum; applying a second waveform to the second tuning element to control a second reflectance spectrum; applying a third waveform to the waveguide to control a third reflectance spectrum, wherein the third reflectance spectrum includes a plurality of reflectance peaks located at locations where the first reflectance spectrum and second reflectance spectrum overlap; and modulating at least one of the first, second, and third waveforms to continuously tune the laser. Additionally or alternatively to one or more examples disclosed above, in other examples, wherein the third waveform excludes reflectance peaks due to optical reflections at the interface or boundaries between sections of the laser. Additionally or alternatively to one or more examples disclosed above, in other examples, wherein at least two of the first, second, and third waveforms are modulated simultaneously. Additionally or alternatively to one or more examples disclosed above, in other examples, wherein all of the first, second, and third waveforms are modulated to achieve continuous tuning. Additionally or alternatively to one or more examples disclosed above, in other examples, wherein applying the third waveform includes uniform distribution along a length of the laser. Additionally or alternatively to one or more examples disclosed above, in other examples, wherein the laser further comprises a third tuning element, the method further comprises: applying a fourth waveform to the third tuning element to control an optical path length of a cavity of the laser.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. A semiconductor laser comprising:
 a first grating section;
 a second grating section;
 a first set of diffraction gratings included in the first grating section, the first set of diffraction gratings comprising multiple first groups of grating elements;
 a second set of diffraction gratings included in the second grating section, the second set of diffraction grating comprising multiple second groups of grating elements;
 one or more tuning sections;
 an optical gain region;
 a first electrode disposed on the optical gain region and at least one of the first or second grating sections, the first electrode coupled to a first source configured to provide a first driving current to the optical gain region; and
 one or more second electrodes, each second electrode disposed on at least one of the one or more tuning sections, wherein the one or more second electrodes are disposed in a section different from the first and second grating sections and coupled to a second source separate from the first source and configured to provide a second driving current to the one or more tuning sections to control properties of the at least one of the first or second grating sections,
 wherein:
  each group of the multiple first groups of grating elements is separated by a first spacing;
  each group of the multiple second groups of grating elements is separated by a second spacing different than the first spacing;
  the semiconductor laser includes a reflection spectrum comprising a plurality of peaks with a wavelength spacing;
  a periodicity of each of the grating elements of the multiple first groups of grating elements are linearly varied; and
  the first electrode is independently controllable from the one or more second electrodes such that a change of one is independent from a change of the other.

2. The laser of claim 1, further comprising:
 a trench located at least partially between the first electrode and at least one of the one or more second electrodes.

3. The laser of claim 2, wherein the trench is associated with at least one of the one or more second electrodes, and an injection of a current into the at least one of the one or more second electrodes generates heat.

4. The laser of claim 2, further comprising:
 a second trench different from the trench and associated with a different one of the first or second grating sections.

5. The laser of claim 1, wherein the wavelength spacing of the first grating section is different from the wavelength spacing of the second grating section.

6. The laser of claim 5, further comprising:
 a first region located between the first grating section and the second grating section, wherein the first region excludes diffraction gratings.

7. The laser of claim 6, wherein the first region includes a phase section, the laser further comprising:
 a third electrode disposed proximate to the phase section.

8. The laser of claim 5, wherein an area of the first grating section is different from an area of the second grating section.

9. The laser of claim 1, further comprising:
 at least one of a sampled grating (SG) Distributed Bragg Reflector (DBR), phase-reversal grating DBR, superstructure grating (SSG) DBR, and binary superposition grating (BSG) DBR.

10. The laser of claim 1, wherein the laser includes an optical cavity reflectance spectrum comprising a single peak, within an active region gain spectrum of the laser, formed by reflectance peaks from the first and second grating sections that overlap at least partially, wherein the plurality of output peaks excludes an interfacial reflectance.

11. The laser of claim 1, wherein each of the one or more tuning sections is a heater or a phase section.

12. The laser of claim 1, wherein a length of the first electrode is substantially equal to a length of the laser, wherein the length of the laser is along a direction of light propagation in the optical gain region.

13. The laser of claim 1, wherein the laser is included in a device, the device further comprises:
 one or more electrical sources, each source coupled to one of the one or more second electrodes; and
 a controller coupled to the one or more sources and configured to adjust the one or more sources based on at least one of a temperature of one of the first or second grating sections, a temperature of the active region, an emission wavelength, an output power, and a tuning range.

14. The laser of claim 1, wherein the laser is capable of continuous tuning within a single channel, wherein the single channel corresponds to a range of wavelengths.

15. The semiconductor laser of claim 1, wherein two or more grating sections are first portions of the optical gain region are located in first sections, and a second portion of the optical gain region are located in a second section, the first sections separate from the second section.

16. A method of driving a laser having a waveguide, a first tuning element, a second tuning element, and two or more grating sections, the method comprising:
 applying a first waveform to a first electrode of the first tuning element to control a first reflectance spectrum, wherein the first electrode is disposed in a section different from the two or more grating sections and the first electrode is coupled to a first source configured to provide a first driving current to the first tuning element;

applying a second waveform to a second electrode of the second tuning element to control a second reflectance spectrum, wherein the second electrode is disposed in a section different from the two or more grating sections and coupled to a second source different from the first source and configured to provide a second driving current to the one or more tuning sections to control properties of the at least one of the one or more grating sections;

applying a third waveform to the waveguide to control a third reflectance spectrum, wherein the third reflectance spectrum includes a plurality of reflectance peaks located at locations where the first reflectance spectrum and the second reflectance spectrum overlap; and modulating at least one of the first, second, and third waveforms to continuously tune the laser, wherein:
- a first set of diffraction gratings included in a first grating section of the two or more grating sections, the first set of diffraction gratings comprising multiple first groups of grating elements;
- a second set of diffraction gratings included in a second grating section of the two or more grating sections, the second set of diffraction gratins comprising multiple second groups of grating elements;
- each group of the multiple first groups of grating elements is separated by a first spacing;
- each group of the multiple second groups of grating elements is separated by a second spacing different than the first spacing; and
- a periodicity of each of the grating elements of the multiple first groups of grating elements are linearly varied.

17. The method of claim 16, wherein the third waveform excludes reflectance peaks due to optical reflections at an interface or a boundary between sections of the laser.

18. The method of claim 16, wherein at least two of the first, second, and third waveforms are modulated simultaneously.

19. The method of claim 16, wherein all of the first, second, and third waveforms are modulated to achieve continuous tuning.

20. The method of claim 16, wherein applying the third waveform includes uniform distribution along a length of the laser.

21. The method of claim 16, wherein the laser further comprises a third tuning element, the method further comprising:
applying a fourth waveform to the third tuning element to control an optical path length of a cavity of the laser.

* * * * *